US012720913B2

(12) United States Patent
Mishima et al.

(10) Patent No.: US 12,720,913 B2
(45) Date of Patent: Aug. 25, 2026

(54) LIGHT EMITTING DIODE ELEMENT

(71) Applicant: HAMAMATSU PHOTONICS K.K., Hamamatsu (JP)

(72) Inventors: Asuka Mishima, Hamamatsu (JP); Daisuke Iida, Hamamatsu (JP); Takahide Yanai, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 478 days.

(21) Appl. No.: 18/202,420

(22) Filed: May 26, 2023

(65) Prior Publication Data

US 2023/0395745 A1 Dec. 7, 2023

(30) Foreign Application Priority Data

Jun. 1, 2022 (JP) ................................ 2022-089713

(51) Int. Cl.
*H10H 20/812* (2025.01)
*H10H 20/811* (2025.01)
(Continued)

(52) U.S. Cl.
CPC ........ *H10H 20/812* (2025.01); *H10H 20/811* (2025.01); *H10H 20/813* (2025.01); *H10H 20/8162* (2025.01); *H10H 20/824* (2025.01)

(58) Field of Classification Search
CPC .. H10H 20/811; H10H 20/813; H10H 20/812; H10H 20/8162
See application file for complete search history.

(56) References Cited

U.S. PATENT DOCUMENTS

2009/0173961 A1 7/2009 Windisch et al.
2018/0219122 A1 8/2018 Li et al.
(Continued)

FOREIGN PATENT DOCUMENTS

CN 112103374 * 12/2020
CN 112219286 A 1/2021
(Continued)

OTHER PUBLICATIONS

A. N. Korshak, Z. S. Gribnikov, V. V. Mitin; Tunnel-junction-connected distributed-feedback vertical-cavity surface-emitting laser. Appl. Phys. Lett. Sep. 14, 1998; 73 (11): 1475-1477. https://doi.org/10.1063/1.122217 (Year: 1998).*
(Continued)

*Primary Examiner* — Matthew L Reames
(74) *Attorney, Agent, or Firm* — Faegre Drinker Biddle & Reath LLP

(57) ABSTRACT

A light emitting diode element includes: a first element portion including a first semiconductor layer of a first conductivity type, a second semiconductor layer of a second conductivity type, and a first active layer; and a second element portion including a third semiconductor layer of the first conductivity type, a fourth semiconductor layer of the second conductivity type, and a second active layer. The first and second element portions are electrically connected to each other by a tunnel junction portion. When the first conductivity type is n-type, the first element portion includes an electron barrier layer arranged between the first active layer and the tunnel junction portion. When the first conductivity type is p-type, the second element portion includes an electron barrier layer arranged between the second active layer and the tunnel junction portion. The electron barrier layer includes AlGaAsSb or AlInAsSb.

20 Claims, 13 Drawing Sheets

(51) Int. Cl.

| | |
|---|---|
| ***H10H 20/813*** | (2025.01) |
| ***H10H 20/816*** | (2025.01) |
| ***H10H 20/824*** | (2025.01) |

(56) References Cited

U.S. PATENT DOCUMENTS

| | | | | |
|---|---|---|---|---|
| 2020/0013923 | A1* | 1/2020 | Muhowski | H10H 20/821 |
| 2020/0395737 | A1* | 12/2020 | Huang | H01S 5/34353 |

FOREIGN PATENT DOCUMENTS

| | | | |
|---|---|---|---|
| JP | H09-283855 | A | 10/1997 |
| JP | 2018-201009 | A | 12/2018 |
| JP | 2019-169601 | A | 10/2019 |
| JP | 2021-064790 | A | 4/2021 |

OTHER PUBLICATIONS

A. R Altayaret al. Electroluminescence characterization of mid-infrared InAsSb/AlInAs multi-quantum well light emitting diodes heteroepitaxially integrated on GaAs and silicon wafers, Journal of Crystal Growth,vol. 586, 2022, 126627, ISSN 0022-0248, https://doi.org/10.1016/j.jcrysgro.2022.126627. (Year: 2022).*

Jung, Seungyong et al., "Light-Emitting Diodes Operating at 2 μm With 10 mW Optical Power", IEEE Photonics Technology Letters, DOI: 10.1109/LPT.2013.2285153, Dec. 2013, vol. 25, No. 23, pp. 2278-2280.

* cited by examiner

S2
S1
60
50
65
67
66
64
63
62
61
57
56
55
54
51
53
52
40
10
23a
31
23b
22a
32
52a
52b
10b
10a
21a
1
20,22
22b
23
20,21
Z
X
Y

Fig.3
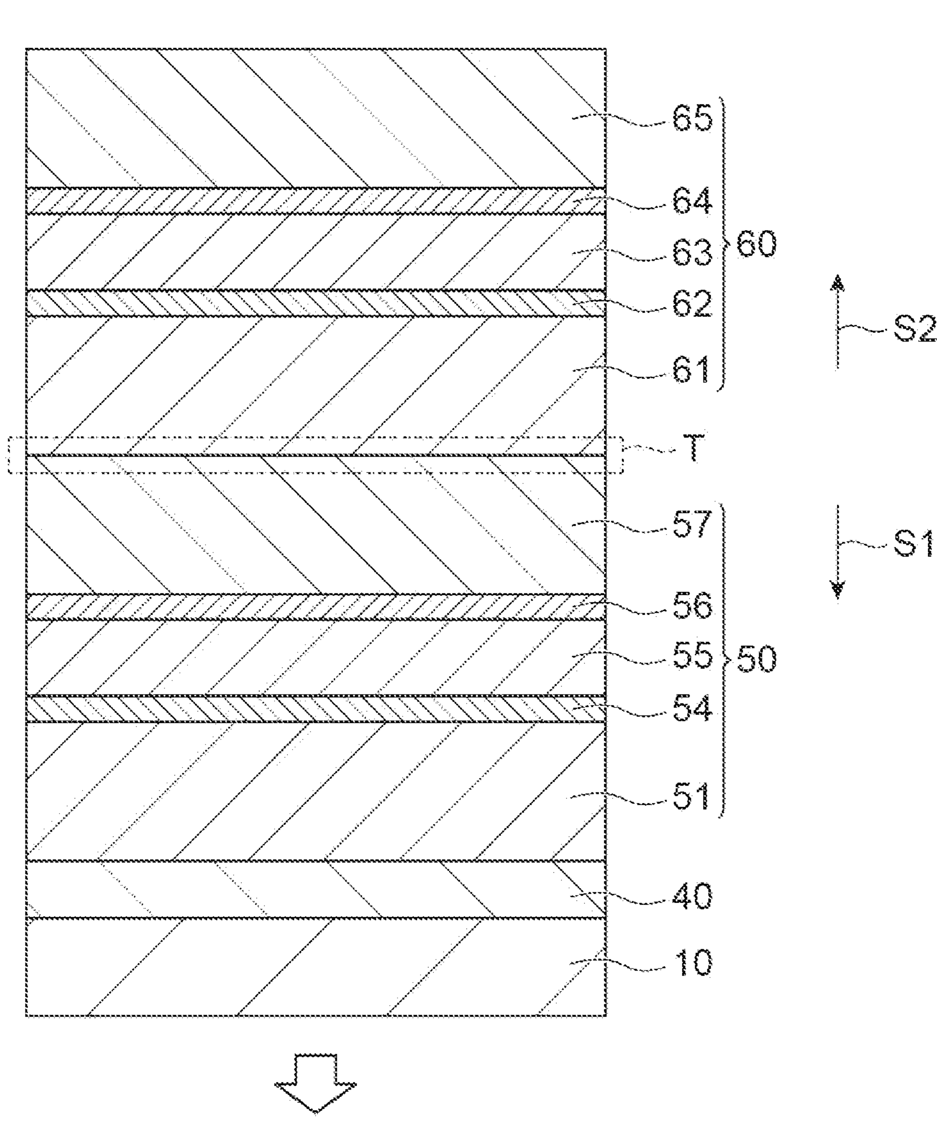
1
65
64
63
60
62
61
T
57
56
55
50
54
51
40
10
S2
S1

Fig.4

| NAME | MATERIAL | FILM THICKNESS [μm] | CARRIER CONCENTRATION [/cm³] |
|---|---|---|---|
| CONTACT LAYER 67 | p-InAs | 0.020 | 1.0E+19 |
| SEMICONDUCTOR LAYER 66 | p-InAs | 0.30 | 5.0E+18 |
| ELECTRON BARRIER LAYER 64 | p-AlGaAsSb | 0.025 | 3.0E+18 |
| SECOND ACTIVE LAYER 63 | AlInAs/InAsSb | 0.020×20 PAIR | NON-DOPED |
| HOLE BARRIER LAYER 62 | n-AlInAs | 0.025 | 3.0E+18 |
| THIRD SEMICONDUCTOR LAYER 61 | n-InAs | 0.050 | 3.0E+18 |
| SECOND SEMICONDUCTOR LAYER 57 | p-InAs | 0.050 | 1.0E+19 |
| ELECTRON BARRIER LAYER 56 | p-AlGaAsSb | 0.025 | 3.0E+18 |
| FIRST ACTIVE LAYER 55 | AlInAs/InAsSb | 0.020×20 PAIR | NON-DOPED |
| HOLE BARRIER LAYER 54 | n-AlInAs | 0.025 | 3.0E+18 |
| CURRENT BLOCKING LAYER 53 | n-InAs | 0.60 | 3.0E+17 |
| CURRENT DIFFUSION LAYER 52 | n-InAs | 4.0 | 3.0E+18 |
| THIRD BUFFER LAYER | InAs | 0.20 | NON-DOPED |
| SECOND BUFFER LAYER | LOW-TEMPERATURE InAs | 0.20 | |
| FIRST BUFFER LAYER | GaAs | 0.20 | |

LIGHT EMITTING DIODE ELEMENT

TECHNICAL FIELD

An aspect of the present disclosure relates to a light emitting diode element.

BACKGROUND

A light emitting diode element is known in which a plurality of active layers are stacked with tunnel junctions interposed therebetween (see, for example, Japanese Unexamined Patent Publication No. 2009-522755).

SUMMARY

Technical Problem

In the light emitting diode element described above, theoretically, it is considered that a light emission output proportional to the number of active layers can be obtained. However, the present inventors have found that simply stacking a plurality of active layers with tunnel junctions interposed therebetween may not provide a light emission output proportional to the number of active layers in a low current region where the applied current is low.

It is an objective of an aspect of the present disclosure to provide a light emitting diode element capable of improving its light emission output.

Solution to Problem

A light emitting diode element according to one aspect of the present disclosure is [1] "a light emitting diode element including: a first element portion including a first semiconductor layer of a first conductivity type, a second semiconductor layer of a second conductivity type different from the first conductivity type, and a first active layer arranged between the first semiconductor layer and the second semiconductor layer; and a second element portion that includes a third semiconductor layer of the first conductivity type, a fourth semiconductor layer of the second conductivity type, and a second active layer arranged between the third semiconductor layer and the fourth semiconductor layer and is arranged on the first element portion. Assuming that a side on which the first element portion is located with respect to the second element portion is a first side and a side on which the second element portion is located with respect to the first element portion is a second side, the second element portion is arranged on the first element portion so that the third semiconductor layer is located on the first side with respect to the second active layer and the second semiconductor layer is located on the second side with respect to the first active layer. The first element portion and the second element portion are electrically connected to each other by a tunnel junction portion. When the first conductivity type is n-type and the second conductivity type is p-type, the first element portion further includes an electron barrier layer arranged between the first active layer and the tunnel junction portion. When the first conductivity type is p-type and the second conductivity type is n-type, the second element portion further includes an electron barrier layer arranged between the second active layer and the tunnel junction portion. Each of the first active layer and the second active layer has a quantum well structure. The electron barrier layer includes AlGaAsSb or AlInAsSb".

In the light emitting diode element, when the first conductivity type is n-type and the second conductivity type is p-type, the first element portion includes an electron barrier layer arranged between the first active layer and the tunnel junction. The electron barrier layer includes AlGaAsSb or AlInAsSb. Therefore, since the band gap energy of AlGaAsSb or AlInAsSb is large, it is possible to suppress the generation of a surface leakage current between the first active layer and the tunnel junction portion. As a result, it is possible to suppress a decrease in the reverse bias voltage applied to the tunnel junction portion due to the surface leakage current, and it is possible to obtain a light emission output proportional to the number of active layers even in a low current region. On the other hand, when the first conductivity type is p-type and the second conductivity type is n-type, the second element portion includes an electron barrier layer arranged between the second active layer and the tunnel junction portion. The electron barrier layer includes AlGaAsSb or AlInAsSb. Therefore, it is possible to suppress the generation of a surface leakage current between the second active layer and the tunnel junction portion. As a result, it is possible to suppress a decrease in the reverse bias voltage applied to the tunnel junction portion due to the surface leakage current, and it is possible to obtain a light emission output proportional to the number of active layers even in a low current region. Therefore, according to the light emitting diode element, it is possible to improve the light emission output. Note that the finding that the reverse bias voltage applied to the tunnel junction portion decreases due to the surface leakage current generated between the first active layer or the second active layer and the tunnel junction portion, and accordingly, the light emission output can be reduced in the low current region is the finding found by the present inventors.

The light emitting diode element according to one aspect of the present disclosure may be [2] "the light emitting diode element according to [1], in which the tunnel junction portion is formed by the second semiconductor layer and the third semiconductor layer tunnel-junctioned to each other". In this case, the thickness of the light emitting diode element can be reduced, for example, as compared with a case where a semiconductor layer forming the tunnel junction portion is additionally provided between the second semiconductor layer and the third semiconductor layer.

The light emitting diode element according to one aspect of the present disclosure may be [3] "the light emitting diode element according to [1], in which the first element portion further includes a fifth semiconductor layer of the second conductivity type having an impurity concentration higher than that of the second semiconductor layer, the second element portion further includes a sixth semiconductor layer of the first conductivity type having an impurity concentration higher than that of the third semiconductor layer, the fifth semiconductor layer is arranged on the second side with respect to the second semiconductor layer, the sixth semiconductor layer is arranged on the first side with respect to the third semiconductor layer, and the tunnel junction portion is formed by the fifth semiconductor layer and the sixth semiconductor layer tunnel-junctioned to each other". In this case, since the amount of carriers supplied through the tunnel junction portion can be increased, it is possible to further improve the light emission output.

The light emitting diode element according to one aspect of the present disclosure may be [4] "the light emitting diode element according to any one of [1] to [3], in which the first conductivity type is n-type and the second conductivity type is p-type". Generally, the light transmittance of an n-type semiconductor is higher than that of a p-type semiconductor. Therefore, for example, by setting the first conductivity type (first semiconductor layer) to n-type in the case of adopting a configuration in which light is emitted from the first semiconductor layer side, light generated in the first active layer and the second active layer can be efficiently emitted to the outside of the light emitting diode element.

The light emitting diode element according to one aspect of the present disclosure may be [5] "the light emitting diode element according to [4], further including a substrate arranged on the first side with respect to the first semiconductor layer. The substrate is transparent to light generated by the first active layer and the second active layer". In this case, it is possible to employ a back surface emission type configuration in which light is emitted from the substrate side.

The light emitting diode element according to one aspect of the present disclosure may be [6] "the light emitting diode element according to [4] or [5], in which the electron barrier layer is arranged between the first active layer and the second semiconductor layer". In this case, it is possible to suppress the generation of a surface leakage current between the first active layer and the tunnel junction portion. In addition, the electron barrier layer suppresses the leakage of carriers injected into the first active layer to the second semiconductor layer. Therefore, since the number of carriers in the first active layer can be kept high, high light emission efficiency can be obtained. When the first conductivity type (first semiconductor layer) is n-type and the second conductivity type (second semiconductor layer) is p-type, the leakage of electrons injected into the first active layer to the second semiconductor layer can be suppressed by the electron barrier layer. Therefore, high light emission efficiency can be obtained.

The light emitting diode element according to one aspect of the present disclosure may be [7] "the light emitting diode element according to any one of [4] to [6], in which the electron barrier layer includes AlGaAsSb, the first active layer includes a plurality of well layers and a plurality of barrier layers that are alternately stacked, each of the plurality of barrier layers includes AlInAs, and a barrier layer located closest to the second side among the plurality of barrier layers is in contact with the electron barrier layer". Therefore, since it is possible to suppress the generation of a tunnel current that does not contribute to light emission in a contact portion between the electron barrier layer and the first active layer, it is possible to further improve the light emission output.

The light emitting diode element according to one aspect of the present disclosure may be [8] "the light emitting diode element according to any one of [1] to [3], in which the first conductivity type is p-type and the second conductivity type is n-type". Generally, the light transmittance of an n-type semiconductor is higher than that of a p-type semiconductor. Therefore, for example, by setting the second conductivity type to n-type in the case of adopting a configuration in which light is emitted from the fourth semiconductor layer side, light generated in the first active layer and the second active layer can be efficiently emitted to the outside of the light emitting diode element.

The light emitting diode element according to one aspect of the present disclosure may be [9] "the light emitting diode element according to [8], in which the electron barrier layer is arranged between the second active layer and the third semiconductor layer". In this case, it is possible to suppress the generation of a surface leakage current between the second active layer and the tunnel junction portion. In addition, the electron barrier layer suppresses the leakage of carriers injected into the second active layer to the third semiconductor layer. Therefore, since the number of carriers in the second active layer can be kept high, high light emission efficiency can be obtained. When the first conductivity type (third semiconductor layer) is p-type and the second conductivity type (fourth semiconductor layer) is n-type, the leakage of electrons injected into the second active layer to the third semiconductor layer can be suppressed by the electron barrier layer. Therefore, high light emission efficiency can be obtained.

The light emitting diode element according to one aspect of the present disclosure may be [10] "the light emitting diode element according to [8] or [9], in which the electron barrier layer includes AlGaAsSb, the second active layer includes a plurality of well layers and a plurality of barrier layers that are alternately stacked, each of the plurality of barrier layers includes AlInAs, and a barrier layer located closest to the first side among the plurality of barrier layers is in contact with the electron barrier layer". In this case, it is possible to suppress the generation of a tunnel current that does not contribute to light emission in a contact portion between the electron barrier layer and the second active layer.

The light emitting diode element according to one aspect of the present disclosure may be [11] "the light emitting diode element according to any one of [1] to [10], in which the electron barrier layer includes AlInAsSb". In this case, it is possible to suppress the generation of a tunnel current that does not contribute to light emission in a contact portion between the electron barrier layer and the first active layer or the second active layer.

The light emitting diode element according to one aspect of the present disclosure may be [12] "the light emitting diode element according to any one of [1] to [11], in which a thickness of the first semiconductor layer is larger than a thickness of the third semiconductor layer". In this case, the current can be more diffused in the first semiconductor layer.

The light emitting diode element according to one aspect of the present disclosure may be [13] "the light emitting diode element according to any one of [1] to [12], further including a substrate arranged on the first side with respect to the first semiconductor layer. The substrate includes GaAs". In this case, it is possible to suppress the absorption of the light generated in the first active layer and the second active layer by the substrate. As a result, in the back surface emission type configuration in which light is emitted from the substrate side, the generated light can be efficiently emitted to the outside of the light emitting diode element.

The light emitting diode element according to one aspect of the present disclosure may be [14] "the light emitting diode element according to any one of [1] to [13], in which each of the first active layer and the second active layer generates light having a wavelength of 3 μm or more and 5 μm or less". In this case, the light emitting diode element can be configured as an element that outputs infrared light.

The light emitting diode element according to one aspect of the present disclosure may be [15] "the light emitting diode element according to any one of [1] to [14], in which a wavelength of light generated by the first active layer is different from a wavelength of light generated by the second active layer". In this case, light components having a plurality of wavelengths can be emitted from the light emitting diode element. Such a light emitting diode element is advantageous in terms of optical design as compared with, for example, a case of using a plurality of light emitting diode elements that emit light components with different wavelengths.

The light emitting diode element according to one aspect of the present disclosure may be [16] “the light emitting diode element according to any one of [1] to [15], in which when the first conductivity type is n-type and the second conductivity type is p-type, the second element portion further includes an electron barrier layer arranged between the second active layer and the fourth semiconductor layer”. In this case, it is possible to suppress the leakage of electrons injected into the second active layer to the fourth semiconductor layer. Alternatively, the light emitting diode element according to one aspect of the present disclosure may be [16] “the light emitting diode element according to any one of [1] to [15], in which when the first conductivity type is p-type and the second conductivity type is n-type, the first element portion further includes an electron barrier layer arranged between the first active layer and the first semiconductor layer”. In this case, it is possible to suppress the leakage of electrons injected into the first active layer to the first semiconductor layer.

The light emitting diode element according to one aspect of the present disclosure may be [17] “the light emitting diode element according to [16], in which when the first conductivity type is n-type and the second conductivity type is p-type, the electron barrier layer arranged between the second active layer and the fourth semiconductor layer includes AlGaAsSb or AlInAsSb, and when the first conductivity type is p-type and the second conductivity type is n-type, the electron barrier layer arranged between the first active layer and the first semiconductor layer includes AlGaAsSb or AlInAsSb". In the former case, it is possible to more reliably suppress the leakage of electrons to the fourth semiconductor layer by using the electron barrier layer arranged between the second active layer and the fourth semiconductor layer. In the latter case, it is possible to more reliably suppress the leakage of electrons to the first semiconductor layer by using the electron barrier layer arranged between the first active layer and the first semiconductor layer.

The light emitting diode element according to one aspect of the present disclosure may be [18] “the light emitting diode element according to any one of [1] to [17], in which each of the first semiconductor layer, the second semiconductor layer, the third semiconductor layer, and the fourth semiconductor layer includes 50% or more of InAs”. In the light emitting diode element configured in this manner, the surface leakage current described above is likely to be generated. However, according to the light emitting diode element according to one aspect of the present disclosure, even in such a case, it is possible to suppress the generation of the surface leakage current and improve the light emission output.

The light emitting diode element according to one aspect of the present disclosure may be [19] “the light emitting diode element according to any one of [1] to [18], further including a third element portion including a semiconductor layer of the first conductivity type, a semiconductor layer of the second conductivity type, and an active layer arranged between the semiconductor layer of the first conductivity type and the semiconductor layer of the second conductivity type. The third element portion is arranged on the first side with respect to the first element portion or on the second side with respect to the second element portion. In the third element portion, the semiconductor layer of the first conductivity type is located on the first side with respect to the active layer, and the semiconductor layer of the second conductivity type is located on the second side with respect to the active layer”. In this case, the light emitting diode element includes at least three active layers. Therefore, it is possible to improve the light emission output.

A light emitting diode element according to another aspect of the present disclosure is [20] “a light emitting diode element including a plurality of element portions stacked along a stacking direction, each of the plurality of element portions including a semiconductor layer of a first conductivity type, a semiconductor layer of a second conductivity type different from the first conductivity type, and an active layer arranged between the semiconductor layer of the first conductivity type and the semiconductor layer of the second conductivity type. The plurality of element portions include a first terminating element portion located at an end on a first side in the stacking direction and a second terminating element portion located at an end on a second side opposite to the first side in the stacking direction. In each of the plurality of element portions, the semiconductor layer of the first conductivity type is located on the first side with respect to the active layer, and the semiconductor layer of the second conductivity type is located on the second side with respect to the active layer. The element portions adjacent to each other are electrically connected to each other by a tunnel junction portion. When the first conductivity type is n-type and the second conductivity type is p-type, a reference element portion that is at least one of the plurality of element portions other than the second terminating element portion further includes an electron barrier layer arranged between the active layer of the reference element portion and the tunnel junction portion electrically connecting the reference element portion to the element portion adjacent to the reference element portion on the second side. When the first conductivity type is p-type and the second conductivity type is n-type, a reference element portion that is at least one of the plurality of element portions other than the first terminating element portion further includes an electron barrier layer arranged between the active layer of the reference element portion and the tunnel junction portion electrically connecting the reference element portion to the element portion adjacent to the reference element portion on the first side. The active layer has a quantum well structure. The electron barrier layer includes AlGaAsSb or AlInAsSb".

In the light emitting diode element, when the first conductivity type is n-type and the second conductivity type is p-type, a reference element portion, which is at least one of the plurality of element portions other than the second terminating element portion, includes an electron barrier layer arranged between an active layer of the reference element portion and a tunnel junction portion that electrically connects the reference element portion to an element portion adjacent to the reference element portion on the second side. The electron barrier layer includes AlGaAsSb or AlInAsSb. Therefore, it is possible to suppress the generation of the surface leakage current between the active layer of the reference element portion and the tunnel junction portion by using the electron barrier layer. On the other hand, when the first conductivity type is p-type and the second conductivity type is n-type, a reference element portion, which is at least one of the plurality of element portions other than the first terminating element portion, includes an electron barrier layer arranged between an active layer of the reference element portion and a tunnel junction portion that electrically connects the reference element portion to an element portion adjacent to the reference element portion on the first side. The electron barrier layer includes AlGaAsSb or AlInAsSb. Therefore, it is possible to suppress the generation of the surface leakage current between the active layer of the reference element portion and the tunnel junction portion by using the electron barrier layer. As a result, it is possible to suppress a decrease in the reverse bias voltage applied to the tunnel junction portion due to the surface leakage current, and it is possible to obtain a light emission output proportional to the number of active layers even in a low current region.

The light emitting diode element according to another aspect of the present disclosure may be [21] "the light emitting diode element according to [20], in which when the first conductivity type is n-type and the second conductivity type is p-type, all of the plurality of element portions other than the second terminating element portion are the reference element portions, and when the first conductivity type is p-type and the second conductivity type is n-type, all of the plurality of element portions other than the first terminating element portion are the reference element portions". In this case, it is possible to effectively suppress the generation of the surface leakage current.

A light emitting diode element according to still another aspect of the present disclosure may be [22] "a light emitting diode element including: a first element portion including a first semiconductor layer of a first conductivity type, a second semiconductor layer of a second conductivity type different from the first conductivity type, and a first active layer arranged between the first semiconductor layer and the second semiconductor layer; a second element portion that includes a third semiconductor layer of the first conductivity type, a fourth semiconductor layer of the second conductivity type, and a second active layer arranged between the third semiconductor layer and the fourth semiconductor layer and is arranged on the first element portion; and a third element portion including a seventh semiconductor layer of the first conductivity type, an eighth semiconductor layer of the second conductivity type, and a third active layer arranged between the seventh semiconductor layer and the eighth semiconductor layer and is arranged on the second element portion. Assuming that a side on which the first element portion is located with respect to the second element portion is a first side and a side on which the second element portion is located with respect to the first element portion is a second side, the second element portion is arranged on the first element portion so that the third semiconductor layer is located on the first side with respect to the second active layer and the second semiconductor layer is located on the second side with respect to the first active layer, and the third element portion is arranged on the second element portion so that the seventh semiconductor layer is located on the first side with respect to the third active layer and the fourth semiconductor layer is located on the second side with respect to the second active layer. The first element portion and the second element portion are electrically connected to each other by a first tunnel junction portion. The second element portion and the third element portion are electrically connected to each other by a second tunnel junction portion. When the first conductivity type is n-type and the second conductivity type is p-type, the first element portion further includes a first electron barrier layer arranged between the first active layer and the first tunnel junction portion. When the first conductivity type is p-type and the second conductivity type is n-type, the third element portion further includes a second electron barrier layer arranged between the third active layer and the second tunnel junction portion. Each of the first active layer, the second active layer, and the third active layer has a quantum well structure. Each of the first electron barrier layer and the second electron barrier layer includes AlGaAsSb or AlInAsSb".

In the light emitting diode element, for the reasons described above, when the first conductivity type is n-type and the second conductivity type is p-type, it is possible to suppress the generation of the surface leakage current between the first active layer and the first tunnel junction portion by using the first electron barrier layer, and when the first conductivity type is p-type and the second conductivity type is n-type, it is possible to suppress the generation of the surface leakage current between the third active layer and the second tunnel junction portion by using the second electron barrier layer. As a result, it is possible to improve the light emission output. In addition, it is also possible to improve the light emission output by providing three active layers of the first active layer, the second active layer, and the third active layer.

The light emitting diode element according to still another aspect of the present disclosure may be [23] "the light emitting diode element according to [22], in which when the first conductivity type is n-type and the second conductivity type is p-type, the second element portion further includes a third electron barrier layer arranged between the second active layer and the second tunnel junction portion, when the first conductivity type is p-type and the second conductivity type is n-type, the second element portion further includes a fourth electron barrier layer arranged between the second active layer and the first tunnel junction portion, and each of the third electron barrier layer and the fourth electron barrier layer includes AlGaAsSb or AlInAsSb". In the former case, it is possible to suppress the generation of the surface leakage current between the second active layer and the second tunnel junction portion by using the third electron barrier layer. In the latter case, it is possible to suppress the generation of the surface leakage current between the second active layer and the first tunnel junction portion by using the fourth electron barrier layer.

According to an aspect of the present disclosure, it is possible to provide a light emitting diode element capable of improving its light emission output.

BRIEF DESCRIPTION OF THE DRAWINGS

FIG. 3 is a schematic cross-sectional view of a semiconductor stacked body provided in the light emitting diode element.

FIG. 4 is a table showing a layer structure of a semiconductor stacked body provided in the light emitting diode element.

DETAILED DESCRIPTION

Figure 1:
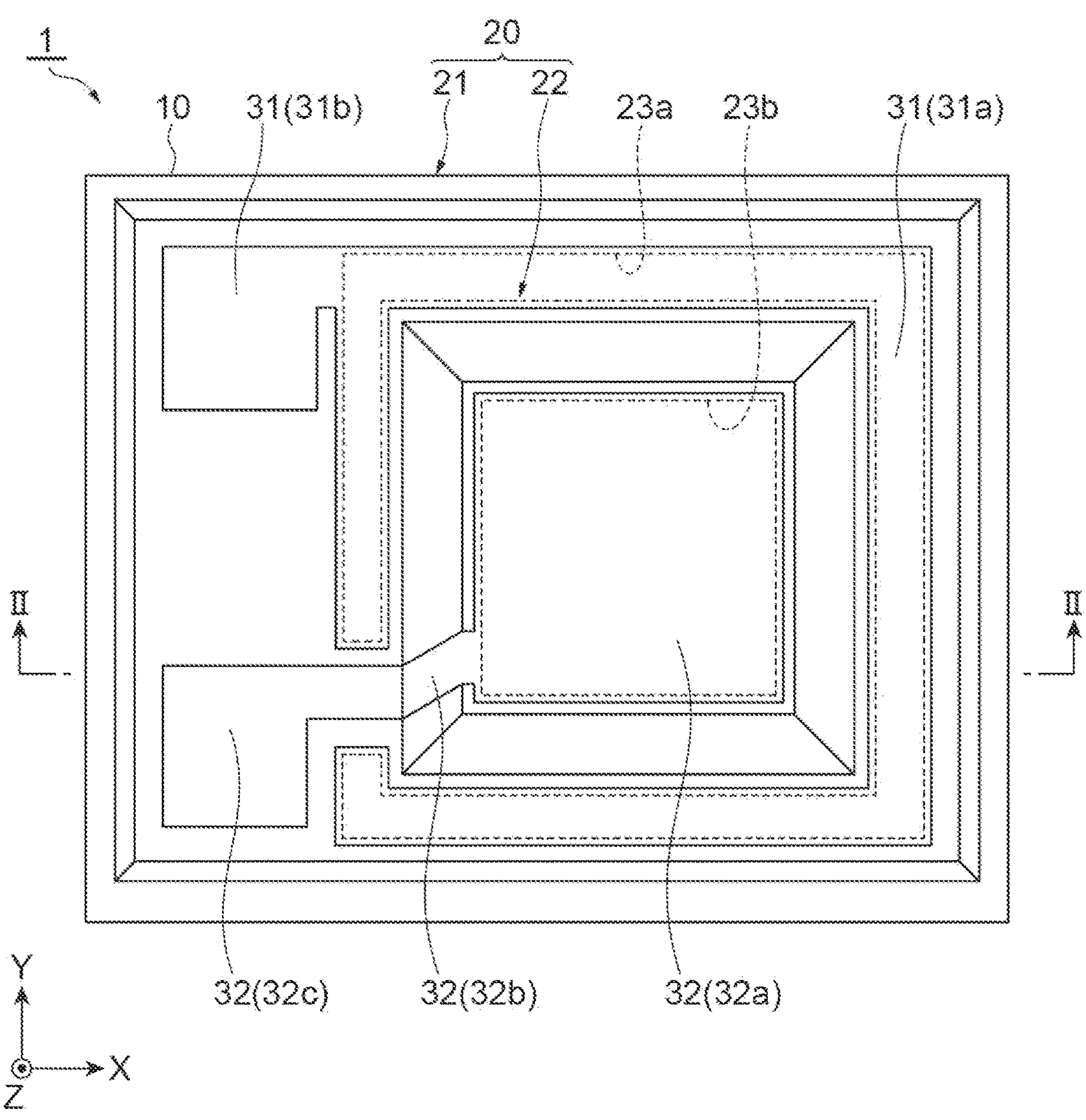
FIG. 1 is a plan view of a light emitting diode element according to an embodiment.
Figure 2:
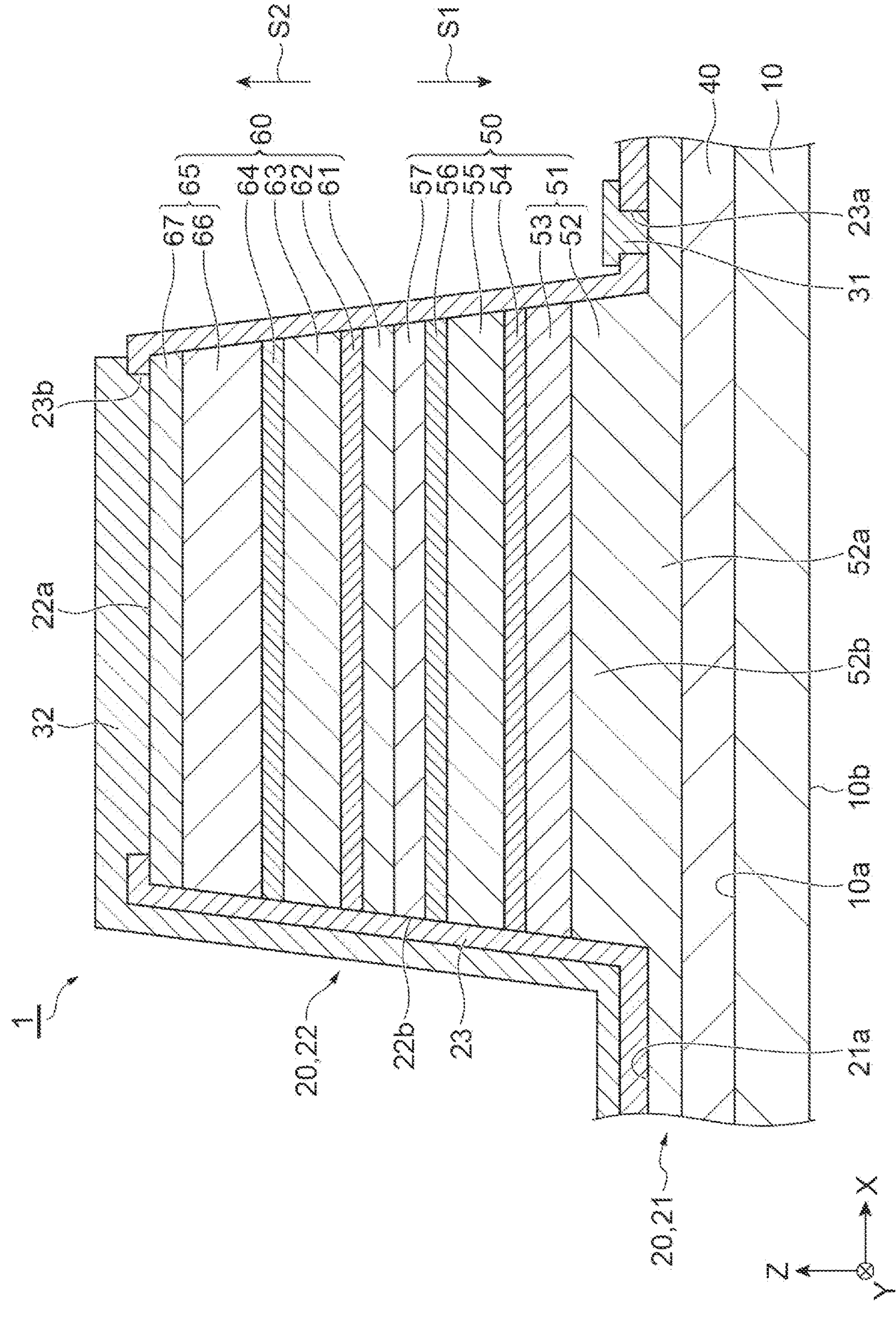
FIG. 2 is a cross-sectional view of the light emitting diode element shown in FIG. 1 along the line II-II.

Hereinafter, embodiments of an aspect of the present disclosure will be described in detail with reference to the diagrams. In the following description, the same or equivalent elements are denoted by the same reference numerals, and repeated description thereof will be omitted.

As shown in FIGS. 1 to 4, a light emitting diode element 1 includes a substrate 10, a semiconductor stacked body 20, a first electrode 31, and a second electrode 32. The light emitting diode element 1 is, for example, an infrared LED that generates light with a wavelength of 3 μm or more and 5 μm or less. The light emitting diode element 1 may be applied to a gas sensor, for example. The substrate 10 is a semiconductor substrate, and includes GaAs, for example. The substrate 10 has a main surface 10*a* and a main surface 10*b* on a side opposite to the main surface 10*a*. Hereinafter, the thickness direction of the substrate 10, a direction perpendicular to the Z direction, and a direction perpendicular to the Z direction and the X direction will be described as a Z direction, an X direction, and a Y direction, respectively. "The substrate 10 includes GaAs" means that the material of the substrate 10 includes at least GaAs. For example, a case where the substrate 10 is formed only of GaAs and a case where the substrate 10 is formed of GaAs and materials other than GaAs are included. This point also applies to descriptions of "a member A includes a material B" for other members.

The semiconductor stacked body 20 has a base portion 21 and a mesa portion 22. The base portion 21 is formed on the main surface 10*a* of the substrate 10 and is in contact with the main surface 10*a*. The base portion 21 includes a surface 21*a* facing away from the substrate 10. The mesa portion 22 is formed on the base portion 21 so as to protrude from a part of the surface 21*a*. In this example, the outer shape of the mesa portion 22 when viewed in the Z direction is rectangular. The mesa portion 22 includes a top surface 22*a* facing away from the base portion 21 and side surfaces 22*b* extending from the top surface 22*a* to the surface 21*a*.

The semiconductor stacked body 20 includes a buffer layer 40, a first element portion 50, and a second element portion 60. The buffer layer 40, the first element portion 50, and the second element portion 60 are stacked in this order from the substrate 10 side. Hereinafter, the side on which the first element portion 50 is located with respect to the second element portion 60 is referred to as a first side S1, and the side on which the second element portion 60 is located with respect to the first element portion 50 is referred to as a second side S2.

The buffer layer 40 is a non-doped layer formed on the substrate 10. In the present embodiment, the buffer layer 40 is formed by stacking a first buffer layer including GaAs, a second buffer layer including InAs, and a third buffer layer including InAs in this order from the substrate 10 side (FIG. 4). The thickness (film thickness) of each of the first buffer layer, the second buffer layer, and the third buffer layer is, for example, about 0.2 μm. The second buffer layer may be formed by growing at a lower temperature than the third buffer layer.

The first element portion 50 includes a first semiconductor layer 51, a hole barrier layer 54, a first active layer 55, an electron barrier layer 56, and a second semiconductor layer 57. The first semiconductor layer 51, the hole barrier layer 54, the first active layer 55, the electron barrier layer 56, and the second semiconductor layer 57 are stacked in this order from the substrate 10 side.

The first semiconductor layer 51 has an n-type conductivity type (first conductivity type), and is located on the first side S1 with respect to the first active layer 55. The first semiconductor layer 51 includes a current diffusion layer 52 formed on the buffer layer 40 and a current blocking layer 53 formed on the current diffusion layer 52. In the present embodiment, the current diffusion layer 52 includes InAs and has a thickness of about 4.0 μm. The current diffusion layer 52 has an n-type conductivity type. The impurity concentration in the current diffusion layer 52 is, for example, about $3.0\times10^{18}/cm^3$. The current diffusion layer 52 is in contact with the first electrode 31, which will be described later, and also functions as a contact layer.

The current diffusion layer 52 has a first portion 52*a* formed on the buffer layer 40 and a second portion 52*b* formed so as to protrude from the first portion 52*a* toward the second side S2. The first portion 52*a* forms the base portion 21 together with the buffer layer 40. The second portion 52*b* forms the mesa portion 22 together with the second element portion 60 and other layers of the first element portion 50, which will be described later.

In the present embodiment, the current blocking layer 53 includes InAs and has a thickness of about 0.6 μm. The current blocking layer 53 has an n-type conductivity type. The impurity concentration in the current blocking layer 53 is, for example, about $3.0\times10^{17}/cm^3$. In the present embodiment, the thickness of the first semiconductor layer 51 is larger than the thickness of a third semiconductor layer 61, which will be described later. The thickness of the first semiconductor layer 51 is, for example, the sum of the thickness of the current diffusion layer 52 and the thickness of the current blocking layer 53.

The hole barrier layer 54 is formed on the current blocking layer 53 and arranged between the first semiconductor layer 51 and the first active layer 55. In the present embodiment, the hole barrier layer 54 includes AlInAs and has a thickness of about 0.025 μm. The hole barrier layer 54 has an n-type conductivity type. The impurity concentration in the hole barrier layer 54 is, for example, about $3.0\times10^{18}/cm^3$. The hole barrier layer 54 suppresses the leakage of holes supplied to the first active layer 55 to the first semiconductor layer 51 (first side S1).

Figure 5:
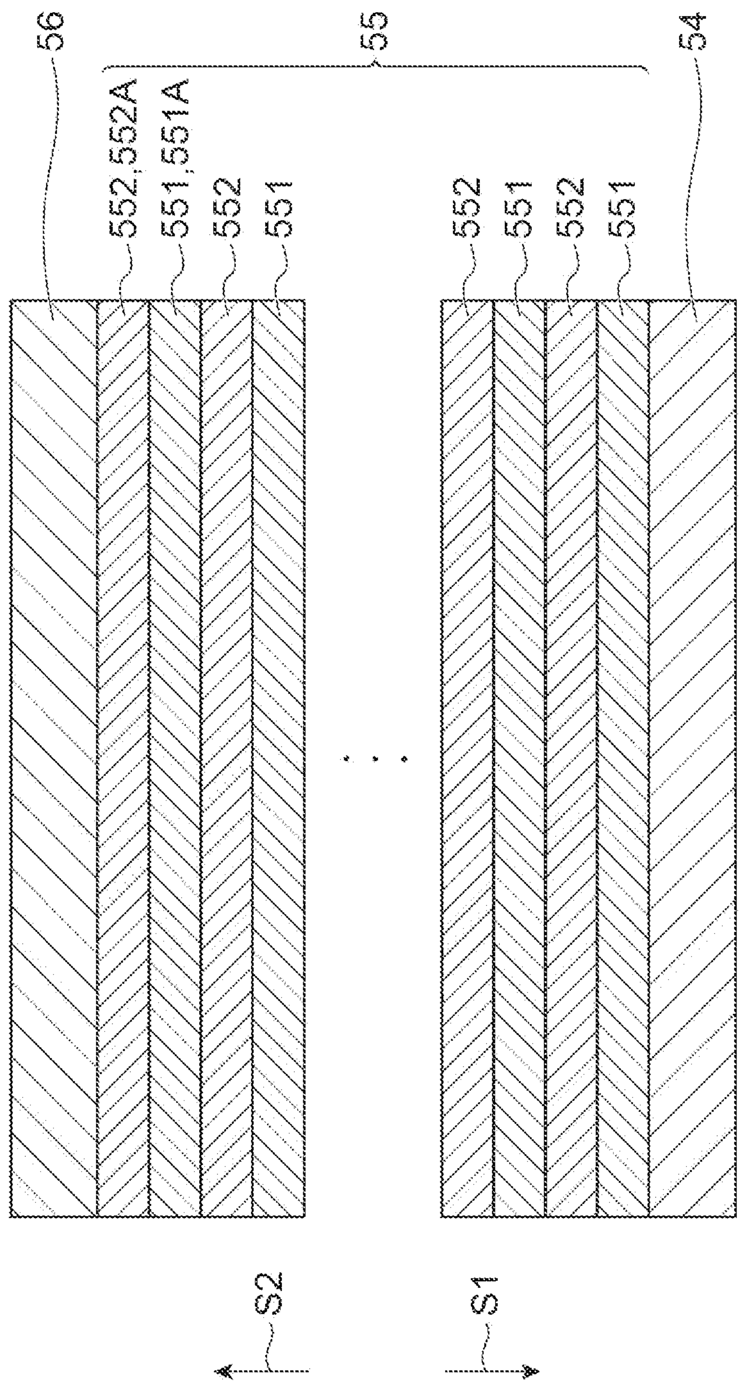
FIG. 5 is a schematic cross-sectional view of a first active layer.

The first active layer 55 is formed on the hole barrier layer 54. The first active layer 55 is, for example, a non-doped layer. The first active layer 55 is arranged between the first semiconductor layer 51 and the second semiconductor layer 57. As shown in FIG. 5, the first active layer 55 includes a plurality of well layers 551 and a plurality of barrier layers 552 that are alternately stacked, and has a multiple quantum well structure. In the present embodiment, each well layer 551 includes InAsSb. Each barrier layer 552 includes AlInAs. The thickness of each of the well layer 551 and the barrier layer 552 is about 0.010 μm, and a combined thickness thereof is about 0.020 μm. The number of pairs of well layers 551 and barrier layers 552 (the number of quantum wells) in the first active layer 55 is 20, for example. A barrier layer 552A located closest to the second side S2 among the plurality of barrier layers 552 is in contact with the electron barrier layer 56. In other words, the barrier layer 552A is located between the electron barrier layer 56 and the well layer 551A located closest to the second side S2 among the plurality of well layers 551.

The first active layer 55 is configured to generate light having a wavelength of, for example, 3 μm or more and 5 μm or less. As an example, the first active layer 55 may be configured to generate light having a center wavelength of 3.9 μm. The light generated by the first active layer 55 passes through the substrate 10. That is, the substrate 10 is transparent to the light generated by the first active layer 55.

The electron barrier layer 56 is formed on the first active layer 55 and arranged between the first active layer 55 and the second semiconductor layer 57. In the present embodiment, the electron barrier layer 56 includes AlGaAsSb and has a thickness of about 0.025 μm. The electron barrier layer 56 has a p-type conductivity type. The impurity concentration in the electron barrier layer 56 is, for example, about $3.0\times10^{18}/cm^3$. The electron barrier layer 56 suppresses the leakage of electrons supplied to the first active layer 55 to the second semiconductor layer 57 (second side S2). In addition, the electron barrier layer 56 suppresses the occurrence of a surface leakage current between the first active layer 55 and a tunnel junction portion T, which will be described later. The point that the surface leakage current is suppressed by the electron barrier layer 56 will be described later.

The second semiconductor layer 57 has a p-type conductivity type (second conductivity type), and is formed on the electron barrier layer 56. The impurity concentration in the second semiconductor layer 57 is, for example, about $1.0\times10^{19}/cm^3$. The second semiconductor layer 57 is located on the second side S2 with respect to the first active layer 55. In the present embodiment, the second semiconductor layer 57 includes InAs and has a thickness of about 0.050 μm.

The second element portion 60 is arranged on the first element portion 50. The second element portion 60 includes the third semiconductor layer 61, a hole barrier layer 62, a second active layer 63, an electron barrier layer 64, and a fourth semiconductor layer 65. The third semiconductor layer 61, the hole barrier layer 62, the second active layer 63, the electron barrier layer 64, and the fourth semiconductor layer 65 are stacked in this order from the substrate 10 side.

The third semiconductor layer 61 has an n-type conductivity type and is formed on the second semiconductor layer 57. The impurity concentration in the third semiconductor layer 61 is, for example, about $3.0\times10^{18}/cm^3$. The third semiconductor layer 61 is in contact with the second semiconductor layer 57. The third semiconductor layer 61 is located on the first side S1 with respect to the second active layer 63. In the present embodiment, the third semiconductor layer 61 includes InAs and has a thickness of about 0.050 μm.

The hole barrier layer 62 is formed on the third semiconductor layer 61 and arranged between the third semiconductor layer 61 and the second active layer 63. In the present embodiment, the hole barrier layer 62 includes AlInAs and has a thickness of about 0.025 μm. The hole barrier layer 62 has an n-type conductivity type. The impurity concentration in the hole barrier layer 62 is, for example, about $3.0\times10^{18}/cm^3$. The hole barrier layer 62 suppresses the leakage of holes supplied to the second active layer 63 to the third semiconductor layer 61 (first side S1).

The second active layer 63 is formed on the hole barrier layer 62. The second active layer 63 is, for example, a non-doped layer. The second active layer 63 is arranged between the third semiconductor layer 61 and the fourth semiconductor layer 65. Similar to the first active layer 55, the second active layer 63 includes a plurality of well layers and a plurality of barrier layers that are alternately stacked, and has a multiple quantum well structure. In the present embodiment, each well layer includes InAsSb. Each barrier layer includes AlInAs. The thickness of each of the well layer and the barrier layer is about 0.010 μm, and a combined thickness thereof is about 0.020 μm. The number of pairs of well layers and barrier layers (the number of quantum wells) in the second active layer 63 is 20, for example. A barrier layer located closest to the second side S2 among the plurality of barrier layers is in contact with the electron barrier layer 64. In other words, the barrier layer located closest to the second side S2 is located between the electron barrier layer 64 and the well layer located closest to the second side S2.

The second active layer 63 may be configured to generate light having a wavelength of, for example, 3 μm or more and 5 μm or less. As an example, the second active layer 63 may be configured to generate light having a center wavelength of 4.3 μm. Thus, the wavelength (center wavelength) of light generated by the second active layer 63 may be different from the wavelength (center wavelength) of light generated by the first active layer 55. In this example, the wavelength of the light generated by the first active layer 55 is equal to or less than the wavelength of the light generated by the second active layer 63. The light generated by the second active layer 63 passes through the substrate 10. That is, the substrate 10 is transparent to the light generated by the second active layer 63.

The electron barrier layer 64 is formed on the second active layer 63 and arranged between the second active layer 63 and the fourth semiconductor layer 65. In the present embodiment, the electron barrier layer 64 includes AlGaAsSb and has a thickness of about 0.025 μm. The electron barrier layer 64 has a p-type conductivity type. The impurity concentration in the electron barrier layer 64 is, for example, about $3.0\times10^{18}/cm^3$. The electron barrier layer 64 suppresses the leakage of electrons supplied to the second active layer 63 to the fourth semiconductor layer 65 (second side S2).

The fourth semiconductor layer 65 has a p-type conductivity type, and is located on the second side S2 with respect to the second active layer 63. The fourth semiconductor layer 65 includes a semiconductor layer 66 formed on the electron barrier layer 64 and a contact layer 67 formed on the semiconductor layer 66. In the present embodiment, the semiconductor layer 66 includes InAs and has a thickness of about 0.30 μm. The semiconductor layer 66 has a p-type conductivity type. The impurity concentration in the semiconductor layer 66 is, for example, about $5.0\times10^{18}/cm^3$.

In the present embodiment, the contact layer 67 includes InAs and has a thickness of about 0.020 μm. The contact layer 67 has a p-type conductivity type. The impurity concentration in the contact layer 67 is, for example, about $1.0\times10^{19}/cm^3$. The surface of the contact layer 67 on the second side S2 forms the top surface 22$a$ of the mesa portion 22.

The first element portion 50 and the second element portion 60 are electrically connected to each other by the tunnel junction portion T (FIG. 3). In the present embodiment, the p-type second semiconductor layer 57 and the n-type third semiconductor layer 61 are in contact with each other to be tunnel-junctioned to each other, and the tunnel junction portion T is formed by the second semiconductor layer 57 and the third semiconductor layer 61 tunnel-junctioned to each other. More specifically, contact portions between the second semiconductor layer 57 and the third semiconductor layer 61 (a part of the second semiconductor layer 57 on the third semiconductor layer 61 side and a part of the third semiconductor layer 61 on the second semiconductor layer 57 side) form the tunnel junction portion T. The electron barrier layer 56 is arranged between the first active layer 55 and the tunnel junction portion T.

An insulating layer 23 is formed on the base portion 21 and the mesa portion 22. The insulating layer 23 is formed continuously over the surface 21*a* of the base portion 21 and the side surface 22*b* and the top surface 22*a* of the mesa portion 22. An opening 23*a* is formed in a portion of the insulating layer 23 on the surface 21*a*. The opening 23*a* has a shape along the contour of the mesa portion 22 when viewed in the Z direction (FIG. 1). As a result, a part of the surface 21*a* surrounding the mesa portion 22 is exposed from the insulating layer 23 through the opening 23*a*. A rectangular opening 23*b* is formed in a portion of the insulating layer 23 on the top surface 22*a*. As a result, a part of the top surface 22*a* is exposed from the insulating layer 23 through the opening 23*b*.

The first electrode 31 is electrically connected to the first semiconductor layer 51 (current diffusion layer 52) through the opening 23*a* of the insulating layer 23. The first electrode 31 is an n-side electrode (contact) electrically connected to the n-type semiconductor layer (first semiconductor layer 51). The first electrode 31 is formed on the surface 21*a* with the insulating layer 23 interposed therebetween. The first electrode 31 has a first portion 31*a* and a second portion 31*b* continuous with the first portion 31*a*. The first portion 31*a* is formed so as to surround the mesa portion 22 when viewed in the Z direction, and is in contact with the surface 21*a* through the opening 23*a*. The second portion 31*b* can function as an electrode pad for applying a driving voltage.

The second electrode 32 is electrically connected to the fourth semiconductor layer 65 (contact layer 67) through the opening 23*b* of the insulating layer 23. The second electrode 32 is a p-side electrode (contact) electrically connected to the p-type semiconductor layer (fourth semiconductor layer 65). The second electrode 32 has a first portion 32*a*, a second portion 32*b* continuous with the first portion 32*a*, and a third portion 32*c* continuous with the second portion 32*b*. The first portion 32*a* is formed on the top surface 22*a* of the mesa portion 22 with the insulating layer 23 interposed therebetween. The first portion 32*a* is in contact with the top surface 22*a* through the opening 23*b* of the insulating layer 23. The second portion 32*b* is formed on the side surface 22*b* of the mesa portion 22 with the insulating layer 23 interposed therebetween. The third portion 32*c* is formed on the surface 21*a* of the base portion 21 with the insulating layer 23 interposed therebetween. The third portion 32*c* can function as an electrode pad for applying a driving voltage.

Next, the light output operation of the light emitting diode element 1 will be described. When driving the light emitting diode element 1, a voltage is applied between the first electrode 31 and the second electrode 32 and a forward current is supplied from the second electrode 32 toward the first electrode 31. At this time, a reverse bias voltage is applied to the tunnel junction portion T to generate a tunnel current. As a result, the current supplied to the second element portion 60 is supplied to the first element portion 50 through the tunnel junction portion T. Due to the supplied current, the first active layer 55 and the second active layer 63 generates light. The light generated by the first active layer 55 and the second active layer 63 is transmitted through the substrate 10 and emitted to the outside of the light emitting diode element 1. That is, the light emitting diode element 1 is a back surface emission type light emitting element that emits light from the substrate 10 side.

Functions and Effects

In the light emitting diode element 1, the first element portion 50 has the electron barrier layer 56 arranged between the first active layer 55 and the tunnel junction portion T. The electron barrier layer 56 includes AlGaAsSb. Therefore, since the band gap energy of AlGaAsSb is large, it is possible to suppress the generation of a surface leakage current between the first active layer 55 and the tunnel junction portion T. As a result, it is possible to suppress a decrease in the reverse bias voltage applied to the tunnel junction portion T due to the surface leakage current, and it is possible to obtain a light emission output proportional to the number of active layers even in a low current region. Therefore, according to the light emitting diode element 1, it is possible to improve the light emission output. This point will be further described below with reference to FIGS. 6 and 7.

Figure 6:
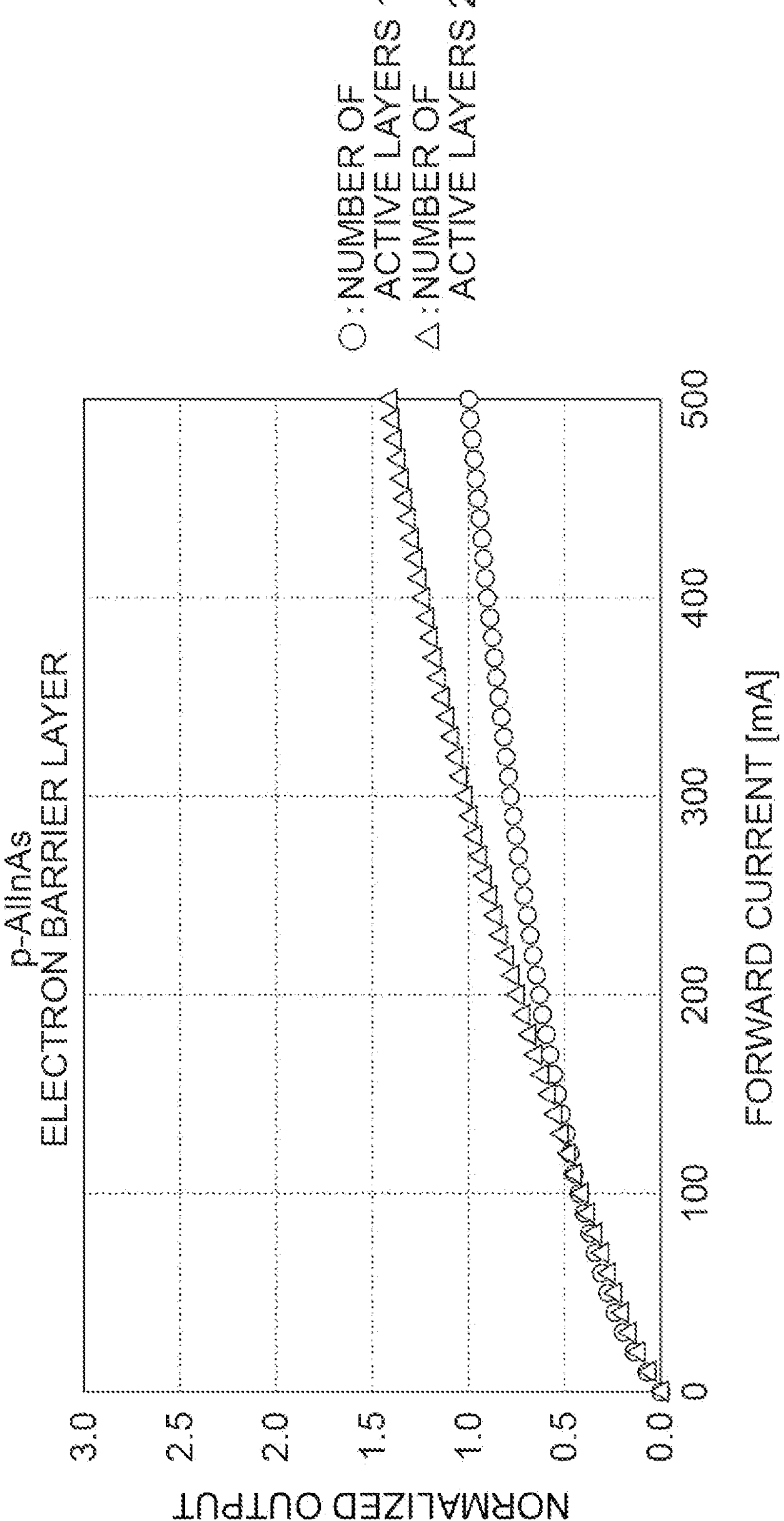
FIG. 6 is a graph showing a relationship between a forward current and a normalized output of a light emitting diode element according to a comparative example.
Figure 7:
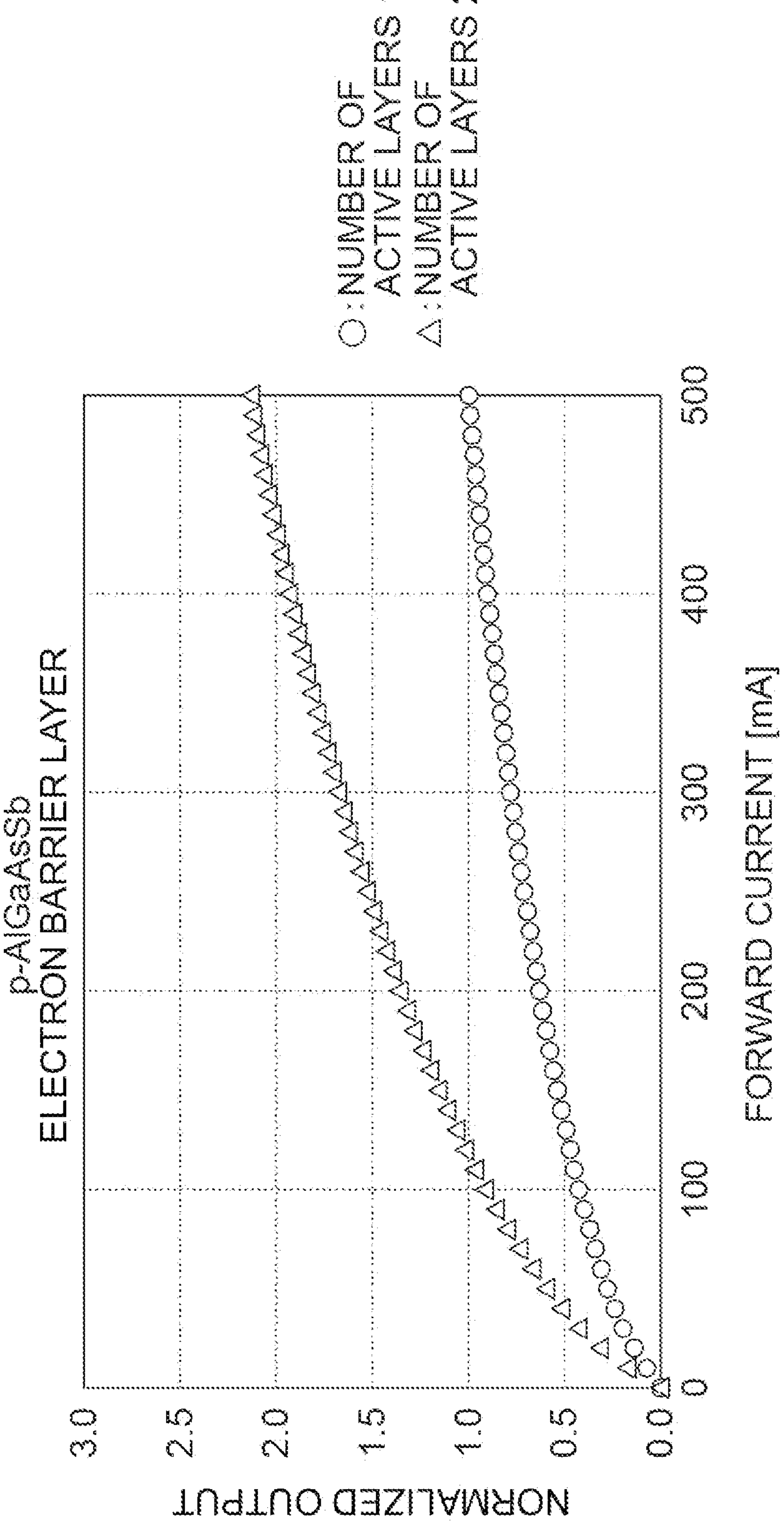
FIG. 7 is a graph showing a relationship of between a forward current and a normalized output of the light emitting diode element according to the present embodiment.

FIG. 6 is a graph showing a relationship between a forward current and a normalized output of a light emitting diode element according to a comparative example, and FIG. 7 is a graph showing a relationship of between a forward current and a normalized output of the light emitting diode element according to the present embodiment. In the light emitting diode element according to the comparative example, the electron barrier layer 56 and the electron barrier layer 64 are formed of AlInAs. Other than that, the light emitting diode element according to the comparative example is configured in the same manner as the light emitting diode element 1 according to the present embodiment. In FIGS. 6 and 7, the light emission output is normalized with the light emission output when a forward current of 500 μmA is supplied to a light emitting diode element having one active layer as 1.0.

Theoretically, a light emitting diode element is considered to provide a light emission output proportional to the number of active layers. That is, it is expected that the light output when the number of active layers is two is about twice the light output when the number of active layers is one. However, as shown in FIG. 6, the light emitting diode element according to the comparative example does not provide a light emission output proportional to the number of active layers. Specifically, there is no difference in light output in a low current region (approximately 100 μmA or less), but a difference in light output according to the number of active layers occurs as the forward current increases. The present inventors have found that simply stacking a plurality of active layers with tunnel junctions interposed therebetween as described above may not provide a light emission output proportional to the number of active layers in a low current region where the applied current is low. In the light emitting diode element according to the comparative example, only the second active layer 63 near the second electrode 32 (p-side electrode) emits strong light in a low current region, and the first active layer 55 may start emitting light when the forward current is increased. Therefore, the low efficiency of carrier injection into the first active layer 55 far from the second electrode 32 (p-side electrode) can be considered as a reason why the light emission output proportional to the number of active layers cannot be obtained in the low current region.

Figure 8:
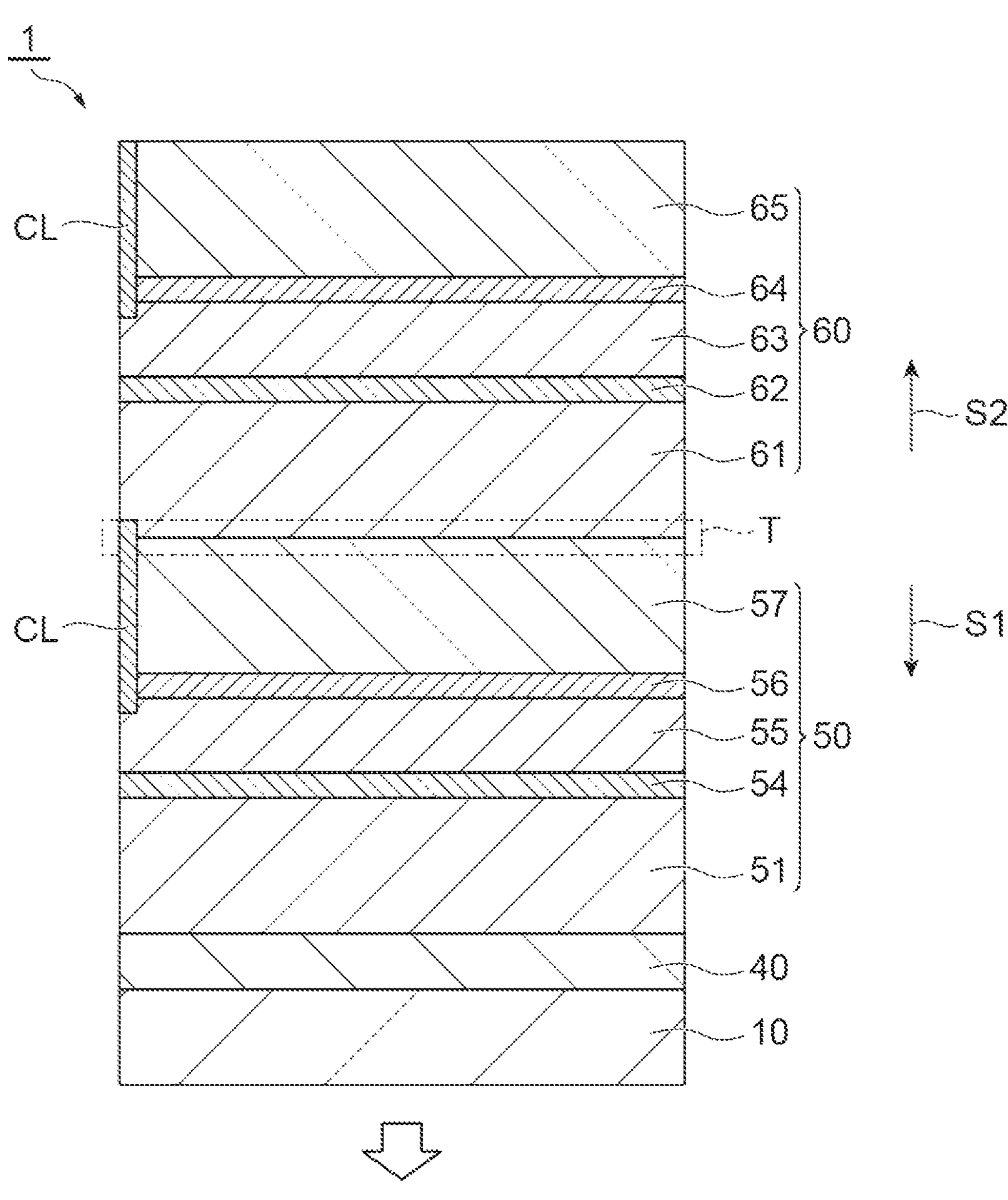
FIG. 8 is a diagram for explaining a surface leakage current generated in a light emitting diode element.

As one of the reasons why the efficiency of carrier injection into the first active layer 55 is low in the light emitting diode element according to the comparative example, a surface leakage current generated in the light emitting diode element can be considered. Specifically, as shown in FIG. 8, a surface leakage current CL can be generated on the surface of the second semiconductor layer 57 through a surface inversion layer due to the interface state. The surface leakage current CL can form a current path between the first active layer 55 and the tunnel junction portion T. The current path due to the surface leakage current CL can form a parallel circuit together with the original current path due to the tunnel junction portion T. For this reason, when the surface leakage current CL is generated, the reverse bias voltage applied to the tunnel junction portion T may decrease. In this case, since the reverse bias voltage does not reach the magnitude required to cause tunnel junction at the tunnel junction portion T, no tunnel current may be generated at the tunnel junction portion T. In this case, since holes (carriers) are not sufficiently supplied to the first active layer 55, the efficiency of carrier injection into the first active layer 55 may decrease. For the above reasons, it is considered that the efficiency of carrier injection into the first active layer 55 may be low in the light emitting diode element according to the comparative example. On the other hand, even if the surface leakage current CL is generated, when the reverse bias voltage becomes high enough to generate a tunnel current, the amount of holes injected into the first active layer 55 greatly increases. Therefore, the first active layer 55 emits strong light. For this reason, it is considered that a light emission output proportional to the number of active layers can be obtained in a region where the forward current is large.

In the light emitting diode element according to the comparative example, the electron barrier layer 56 is formed of AlInAs, whereas in the light emitting diode element 1 according to the present embodiment, the electron barrier layer 56 is formed of AlGaAsSb. Since the band gap energy of AlGaAsSb is larger than the band gap energy of AlInAs, it is possible to suppress the generation of the surface leakage current CL between the first active layer 55 and the tunnel junction portion T in the light emitting diode element 1 according to the present embodiment. That is, the current path due to the surface leakage current CL can be blocked by the electron barrier layer 56. As a result, it is possible to suppress a decrease in the reverse bias voltage applied to the tunnel junction portion T due to the surface leakage current CL, and it is possible to obtain a light emission output proportional to the number of active layers even in a low current region. In practice, as shown in FIG. 7, in the light emitting diode element 1 according to the present embodiment, a light emission output proportional to the number of active layers is obtained even in a low current region. As described above, according to the light emitting diode element 1 according to the present embodiment, it is possible to improve the light emission output. Note that the finding that the light emission output can be reduced due to the surface leakage current CL was found by the present inventors.

Figure 9:
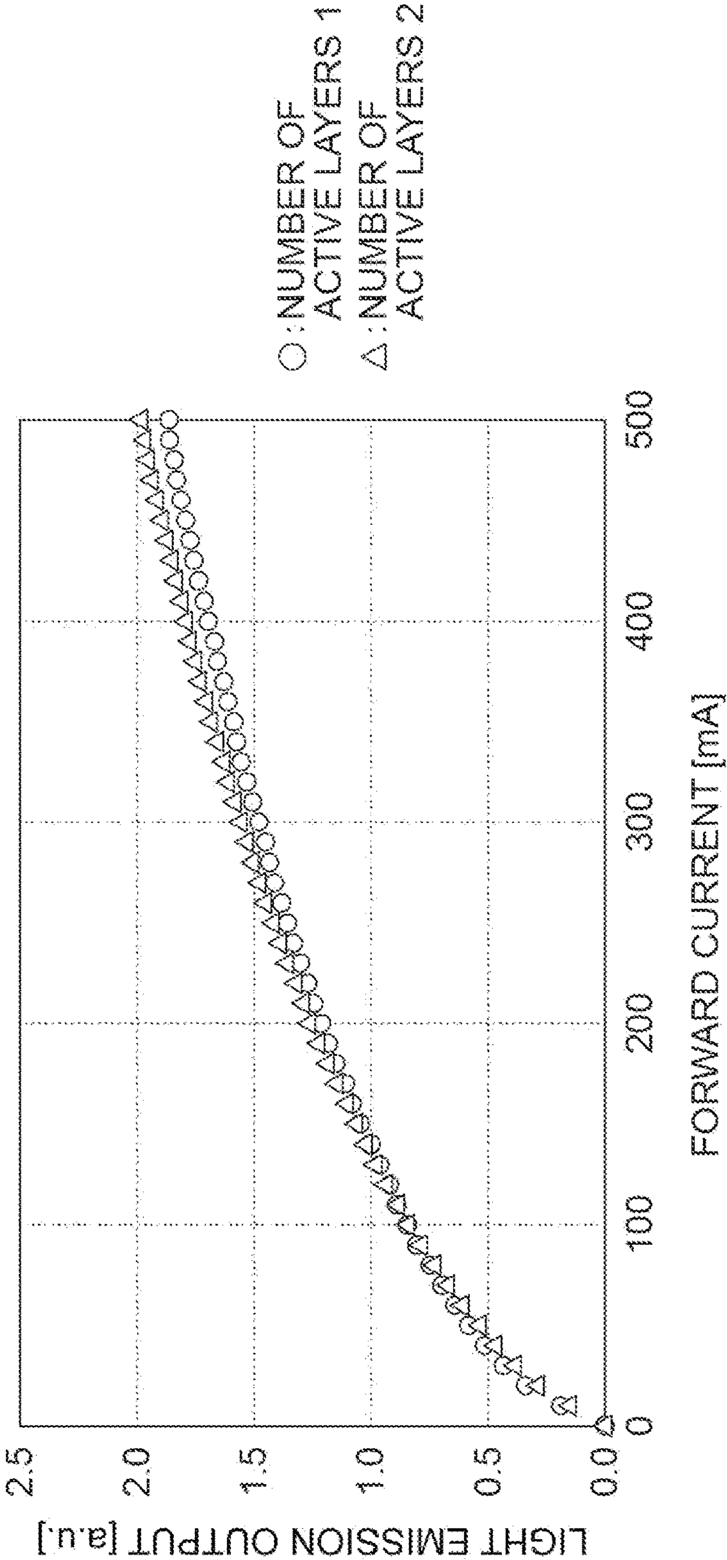
FIG. 9 is a graph showing a relationship between a forward current and a light emission output of a light emitting diode element.

FIG. 9 shows the light emission output of the light emitting diode element 1 having one active layer and the light emission output of a light emitting diode element having two active layers. The light emitting diode element having one active layer is a light emitting diode element having only one element portion including an active layer. The light emitting diode element having two active layers is a light emitting diode element having two element portions each including an active layer, and corresponds to the light emitting diode element 1 according to the present embodiment. The graph for the number of active layers of 2 shows a value obtained by multiplying the light emission output of the light emitting diode element by one half (light emission output for one active layer). As shown in FIG. 9, in the light emitting diode element having two active layers, the saturation tendency of the light emission output is improved especially from around 100 μmA, and the light emission output is improved. This is considered to be due to the following reasons.

In the light emitting diode element 1, the first element portion 50 including the first active layer 55 and the second element portion 60 including the second active layer 63 are connected to each other by the tunnel junction portion T. In such a light emitting diode element 1, as compared with a light emitting diode element having only one element portion including an active layer, current concentration in the element can be decreased to lower the current density. This is considered to be due to the fact that the thickness of the entire light emitting diode element 1 in the stacking direction is increased by stacking a plurality of active layers (element portions) and that it becomes easier to diffuse the current by increasing the number of n-type semiconductor layers, which generally have a lower resistivity than p-type semiconductor layers. When current concentration is decreased to lower the current density, it is possible to suppress factors such as carrier overflow and Auger recombination that lower the light emission output. Therefore, it is possible to improve the light emission output.

In addition, in the back surface emission type light emitting diode element, current concentration is likely to occur generally in a portion near the n-side electrode. Particularly in a high current region, the current concentration tends to be noticeable. In addition, since a material with a small band gap has a high intrinsic carrier density, current concentration is likely to occur when the element is formed of such a material. In the light emitting diode element, current concentration may occur for such reasons. In the light emitting diode element 1 according to the present embodiment, however, since, the first element portion 50 including the first active layer 55 and the second element portion 60 including the second active layer 63 are connected to each other by the tunnel junction portion T, current concentration can be decreased. As a result, it is possible to improve the light emission output.

The tunnel junction portion T is formed by the second semiconductor layer 57 and the third semiconductor layer 61 that are tunnel-junctioned to each other. As a result, the thickness of the light emitting diode element 1 can be reduced, for example, as compared with a case where a semiconductor layer forming the tunnel junction portion T is additionally provided between the second semiconductor layer 57 and the third semiconductor layer 61.

The conductivity type (first conductivity type) of the first semiconductor layer 51 is n-type, and the conductivity type (second conductivity type) of the second semiconductor layer 57 is p-type. Generally, the light transmittance of an n-type semiconductor is higher than that of a p-type semiconductor. Therefore, by setting the conductivity type of the first semiconductor layer 51 to n-type in the case of adopting a configuration in which light is emitted from the first semiconductor layer 51 side, light generated in the first active layer 55 and the second active layer 63 can be efficiently emitted to the outside of the light emitting diode element 1.

The substrate 10 arranged on the first side S1 with respect to the first semiconductor layer 51 is transparent to the light generated by the first active layer 55 and the second active layer 63. Therefore, it is possible to adopt a back surface emission type configuration in which light is emitted from the substrate 10 side.

The electron barrier layer 56 is arranged between the first active layer 55 and the second semiconductor layer 57. Therefore, it is possible to suppress the generation of the surface leakage current CL between the first active layer 55 and the tunnel junction portion T. The electron barrier layer 56 suppresses the leakage of carriers injected into the first active layer 55 to the second semiconductor layer 57. Therefore, since the number of carriers in the first active layer 55 can be kept high, high light emission efficiency can be obtained. When the first conductivity type (first semiconductor layer 51) is n-type and the second conductivity type (second semiconductor layer 57) is p-type, the leakage of electrons injected into the first active layer 55 to the second semiconductor layer 57 can be suppressed by the electron barrier layer 56. Therefore, high light emission efficiency can be obtained.

The electron barrier layer 56 includes AlGaAsSb, the first active layer 55 includes a plurality of well layers 551 and a plurality of barrier layers 552 that are alternately stacked, each of the plurality of barrier layers 552 includes AlInAs, and the barrier layer 552A located closest to the second side S2 among the plurality of barrier layers 552 is in contact with the electron barrier layer 56. Therefore, since it is possible to suppress the generation of a tunnel current (tunnel transition) that does not contribute to light emission in a contact portion between the electron barrier layer 56 and the first active layer 55, it is possible to further improve the light emission output.

Figure 10C:
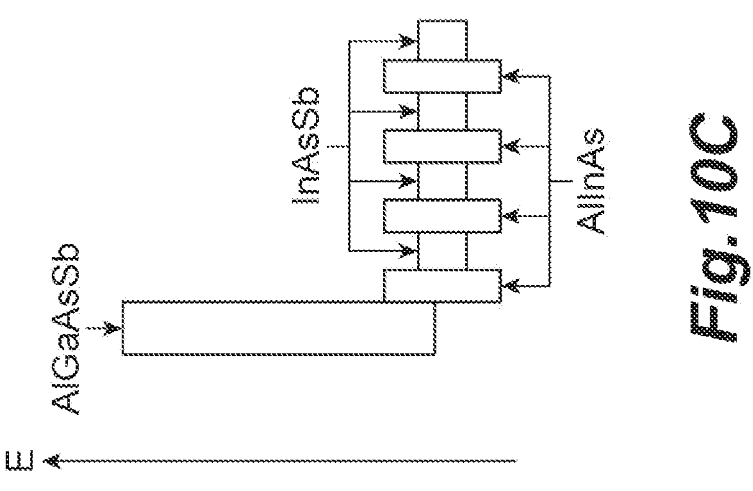
FIG. 10A to 10C are diagrams showing a relationship between the energy band of an electron barrier layer and the energy band of an active layer.
Figure 10B:
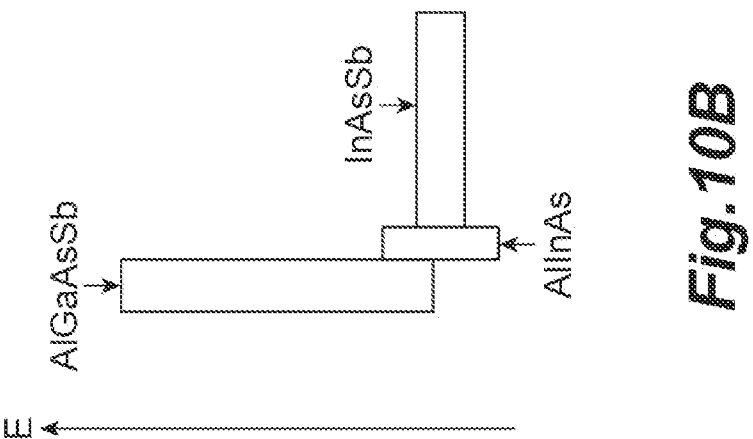
Figure 10A:
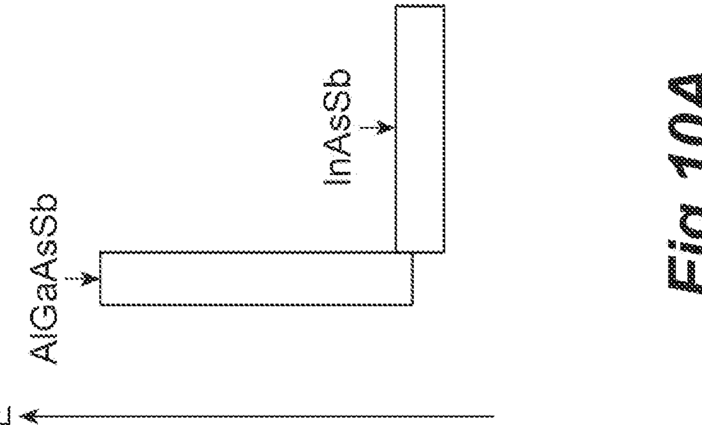

This point will be described more specifically with reference to FIGS. 10A to 10C. FIGS. 10A to 10C show a relationship between the energy band of an electron barrier layer and the energy band of an active layer in contact with the electron barrier layer. In the configuration shown in FIG. 10A, an active layer including InAsSb is in contact with an electron barrier layer including AlGaAsSb. In the configuration shown in FIG. 10B, a barrier layer including AlInAs is arranged between the electron barrier layer including AlGaAsSb and the active layer including InAsSb. The active layer in FIGS. 10A and 10B has a bulk structure including a single semiconductor layer. In the configuration shown in FIG. 10C, an active layer includes a plurality of barrier layers including AlInAs and a plurality of well layers including InAsSb, and a barrier layer is arranged between the well layer and the electron barrier layer including AlGaAsSb. The active layer shown in FIG. 10C has a multiple quantum well structure, and corresponds to the first active layer 55 and the second active layer 63 according to the present embodiment.

In the configuration shown in FIG. 10A, the InAsSb layer is in contact with the AlGaAsSb layer. AlGaAsSb has a composition close to the lattice constant of InAsSb, and the valence band of AlGaAsSb is at the same or slightly higher energy position than the valence band of InAsSb. Therefore, for example, when the energy band position of the AlGaAsSb layer or the InAsSb layer changes due to doping or composition change, the barrier between the InAsSb layer and the AlGaAsSb layer becomes narrow. As a result, a tunnel current may be generated between the AlGaAsSb layer (electron barrier layer) and the InAsSb layer (active layer). Since the tunnel current (tunnel transition) does not contribute to the light emission of the light emitting diode element, it is preferable to suppress the tunnel current (tunnel transition).

On the other hand, in the configurations shown in FIGS. 10B and 10C, the AlInAs layer is inserted between the AlGaAsSb layer and the InAsSb layer. Since the AlInAs layer has a large band gap, it is possible to suppress the generation of a tunnel current between the AlGaAsSb layer and the InAsSb layer. As a result, it is possible to improve the light emission output. In addition, since the doping or composition range of the electron barrier layer or the well layer in which no tunnel current is generated is widened, it is possible to improve the degree of freedom in designing the light emitting diode element 1.

The thickness of the first semiconductor layer 51 is larger than the thickness of the third semiconductor layer 61. Therefore, the current can be more diffused in the first semiconductor layer 51. As a result, since current concentration in the light emitting diode element 1 can be suppressed, it is possible to improve the light emission output.

The light emitting diode element 1 includes the substrate 10 arranged on the first side S1 with respect to the first semiconductor layer 51, the substrate 10 includes GaAs. Therefore, it is possible to suppress the absorption of the light generated in the first active layer 55 and the second active layer 63 by the substrate 10. As a result, in the back surface emission type configuration in which light is emitted from the substrate 10 side, the generated light can be efficiently emitted to the outside of the light emitting diode element 1.

Each of the first active layer 55 and the second active layer 63 generates light with a wavelength of 3 μm or more and 5 μm or less. Therefore, the light emitting diode element 1 can be configured as an element that outputs infrared light.

The wavelength of the light generated by the first active layer 55 is different from the wavelength of the light generated by the second active layer 63. Therefore, light components having a plurality of wavelengths can be emitted from the light emitting diode element 1. Such a light emitting diode element 1 is advantageous in terms of optical design as compared with, for example, a case of using a plurality of light emitting diode elements that emit light components with different wavelengths. Specifically, when using a plurality of light emitting diode elements that emit light components with different wavelengths, the plurality of light emitting diode elements are arranged side by side on the substrate surface, for example. For this reason, the plurality of light emitting diode elements are treated as a surface light source. On the other hand, since the light emitting diode element 1 in which the first active layer 55 and the second active layer 63 are stacked can be treated as a point light source, this is suitable when applied as a light source in a spectroscopic analyzer and the like using light components with different wavelengths.

The second element portion 60 includes the electron barrier layer 64 arranged between the second active layer 63 and the fourth semiconductor layer 65. Therefore, it is possible to suppress the leakage of electrons injected into the second active layer 63 to the fourth semiconductor layer 65. In addition, as shown in FIG. 8, the surface leakage current CL can occur not only on the surface of the second semiconductor layer 57 but also on the surface of the fourth semiconductor layer 65. The surface leakage current CL also reduces the reverse bias voltage applied to the tunnel junction portion T, which can reduce the light emission output in the low current region. On the other hand, in the light emitting diode element 1, the electron barrier layer 64 arranged between the second active layer 63 and the fourth semiconductor layer 65 includes AlGaAsSb. Since the band gap energy of AlGaAsSb is large, it is possible to suppress the generation of the surface leakage current CL between the second active layer 63 and the tunnel junction portion T. As a result, it is possible to suppress a decrease in the reverse bias voltage applied to the tunnel junction portion T due to the surface leakage current CL, and it is possible to obtain a light emission output proportional to the number of active layers even in a low current region.

The electron barrier layer 64 arranged between the second active layer 63 and the fourth semiconductor layer 65 includes AlGaAsSb. Therefore, it is possible to more reliably suppress the leakage of electrons to the fourth semiconductor layer 65 by using the electron barrier layer 64.

Modification Examples

Figure 11:
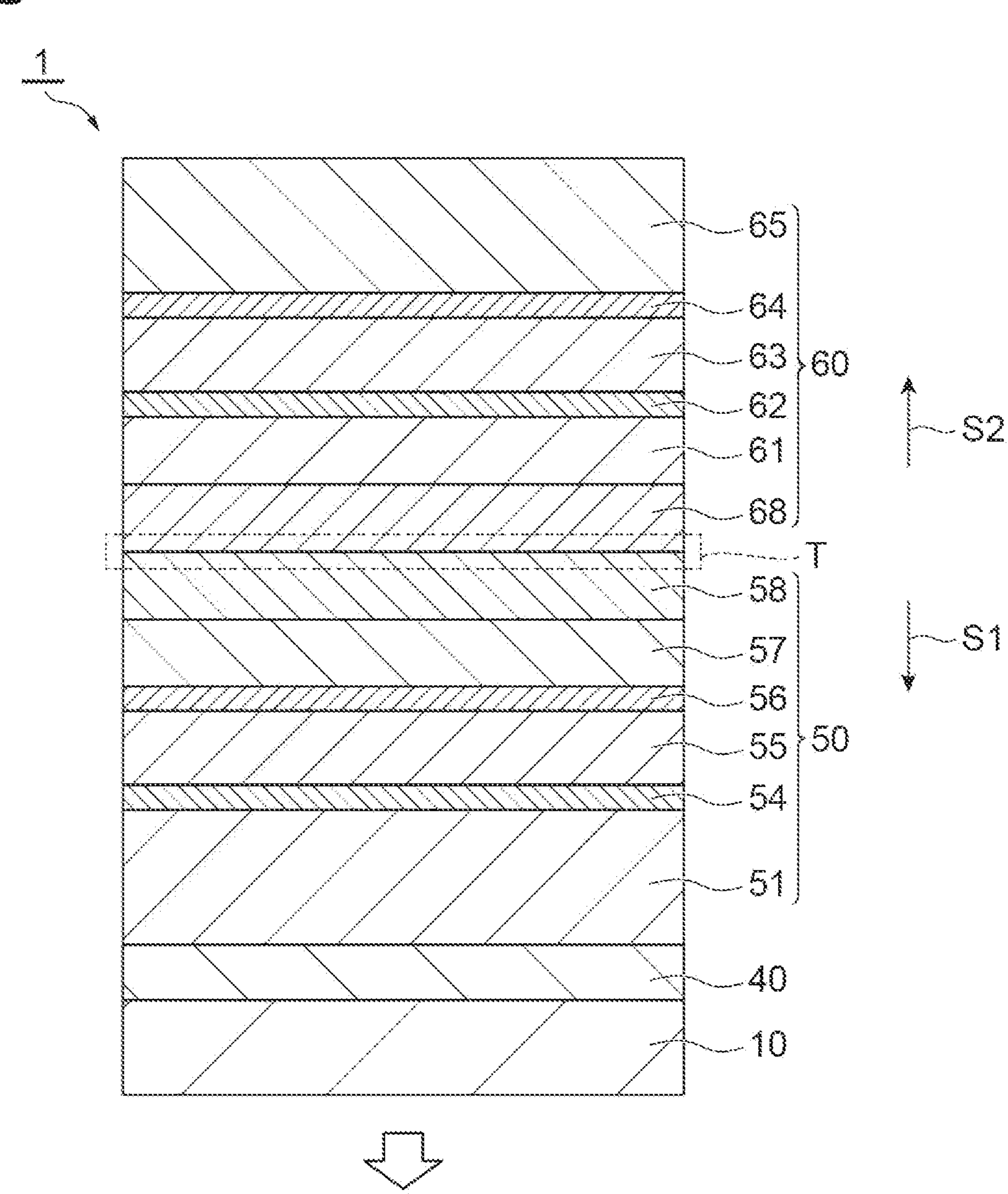
FIG. 11 is a schematic cross-sectional view of a semiconductor stacked body provided in a light emitting diode element according to a first modification example.

In a first modification example shown in FIG. 11, the first element portion 50 further includes a fifth semiconductor layer 58 of a p-type conductivity type, and the second element portion 60 further includes a sixth semiconductor layer 68 of an n-type conductivity type. The fifth semiconductor layer 58 has an impurity concentration higher than that in the second semiconductor layer 57. The impurity concentration in the fifth semiconductor layer 58 may be, for example, twice or more the impurity concentration in the second semiconductor layer 57. The impurity concentration in the fifth semiconductor layer 58 is, for example, about $2.0\times10^{19}/cm^3$. The sixth semiconductor layer 68 has an impurity concentration higher than that in the third semiconductor layer 61. The impurity concentration in the sixth semiconductor layer 68 may be, for example, four times or more the impurity concentration in the third semiconductor layer 61. The impurity concentration in the sixth semiconductor layer 68 is, for example, about $1.2\times10^{19}/cm^3$.

The fifth semiconductor layer 58 is arranged on the second side S2 with respect to the second semiconductor layer 57. The sixth semiconductor layer 68 is arranged on the first side S1 with respect to the third semiconductor layer 61, and is in contact with the fifth semiconductor layer 58. The fifth semiconductor layer 58 and the sixth semiconductor layer 68 are tunnel-junctioned to each other. That is, in the first modification example, the tunnel junction portion T is formed by the fifth semiconductor layer 58 and the sixth semiconductor layer 68. More specifically, a contact portion between the fifth semiconductor layer 58 and the sixth semiconductor layer 68 forms the tunnel junction portion T.

According to the first modification example, it is also possible to improve the light emission output as in the embodiment described above. In addition, since the tunnel junction portion T is formed by the fifth semiconductor layer 58 and the sixth semiconductor layer 68 having a high impurity concentration, it is possible to increase the amount of carriers supplied through the tunnel junction portion T. As a result, it is possible to further improve the light emission output.

Figure 12:
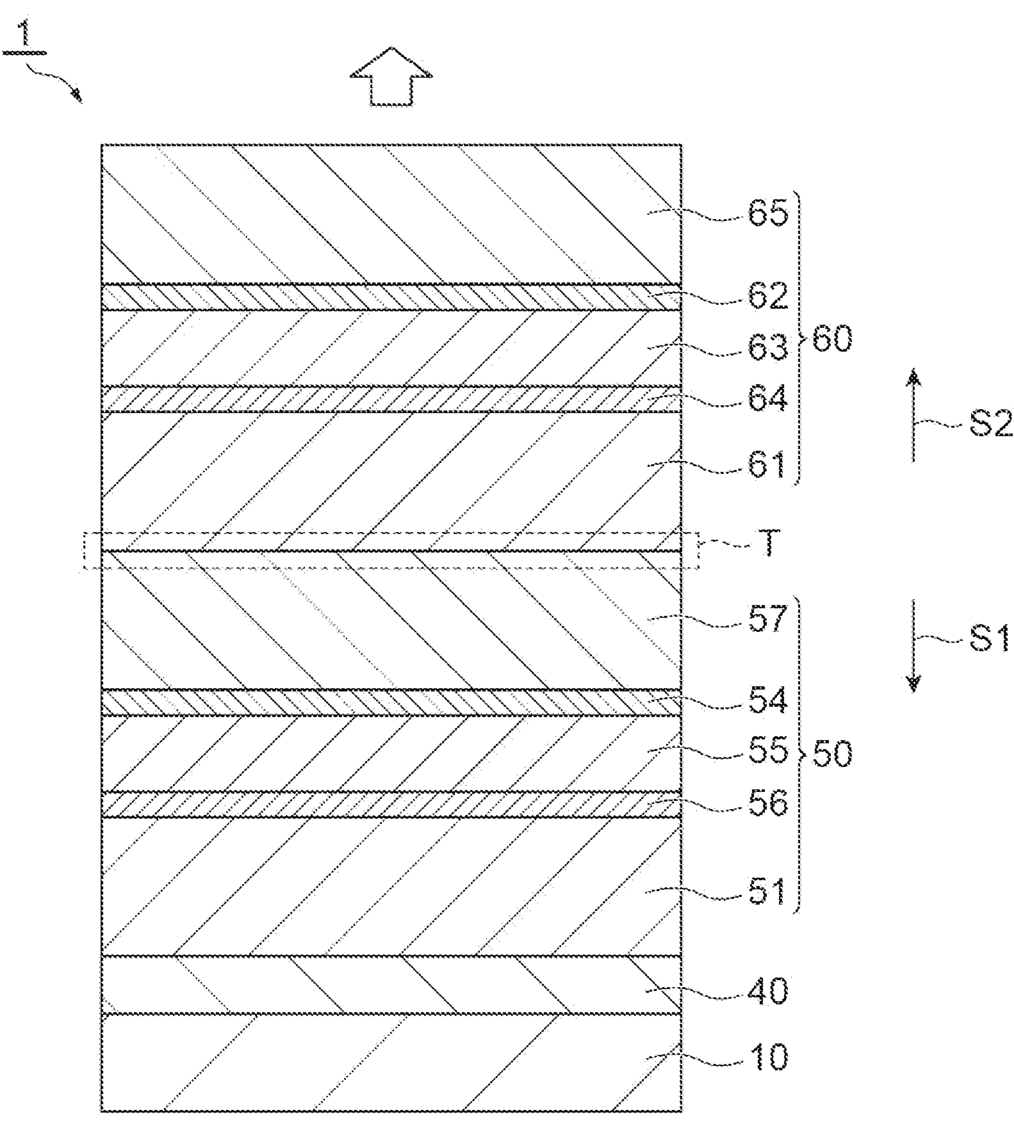
FIG. 12 is a schematic cross-sectional view of a semiconductor stacked body provided in a light emitting diode element according to a second modification example.

In a second modification example shown in FIG. 12, the first semiconductor layer 51 and the third semiconductor layer 61 are p-type semiconductor layers, and the second semiconductor layer 57 and the fourth semiconductor layer 65 are n-type semiconductor layers. In the second modification example, the electron barrier layer 56 is arranged between the first semiconductor layer 51 and the first active layer 55, and the hole barrier layer 54 is arranged between the first active layer 55 and the second semiconductor layer 57. In addition, the electron barrier layer 64 is arranged between the third semiconductor layer 61 and the second active layer 63, and the hole barrier layer 62 is arranged between the second active layer 63 and the fourth semiconductor layer 65. That is, between the second modification example and the above-described embodiment, the positions of the electron barrier layer and the hole barrier layer are reversed. The electron barrier layers 56 and 64 according to the second modification example include AlGaAsSb as in the embodiment described above.

In the second modification example, as in the embodiment described above, each of the first active layer 55 and the second active layer 63 includes a plurality of well layers and a plurality of barrier layers that are alternately stacked, and has a multiple quantum well structure. Each well layer includes InAsSb, and each barrier layer includes AlInAs. A barrier layer located closest to the first side S1 among the plurality of barrier layers included in the first active layer 55 is in contact with the electron barrier layer 56. In other words, a barrier layer included in the first active layer 55 and located closest to the first side S1 is located between the electron barrier layer 56 and a well layer included in the first active layer 55 and located closest to the first side S1. Similarly, a barrier layer located closest to the first side S1 among the plurality of barrier layers included in the second active layer 63 is in contact with the electron barrier layer 64. In other words, a barrier layer included in the second active layer 63 and located closest to the first side S1 is located between the electron barrier layer 64 and a well layer included in the second active layer 63 and located closest to the first side S1.

In the light emitting diode element 1 according to the second modification example, a forward current is supplied from the first semiconductor layer 51 side toward the fourth semiconductor layer 65 side. The supplied current causes the first active layer 55 and the second active layer 63 to generate light. In the second modification example, the light generated by the first active layer 55 and the second active layer 63 is emitted from the fourth semiconductor layer 65 side (second side S2) to the outside of the light emitting diode element 1 without passing through the substrate 10. That is, the light emitting diode element 1 according to the second modification example is a top surface emission type light emitting element that emits light from the side opposite to the substrate 10. In this case, the substrate 10 does not have to be transparent to the light generated by the first active layer 55 and the second active layer 63.

Also in the light emitting diode element 1 according to the second modification example, it is possible to improve the light emission output as in the embodiment described above. That is, in the light emitting diode element 1 according to the second modification example, the electron barrier layer 64 arranged between the second active layer 63 and the tunnel junction portion T includes AlGaAsSb. Since the band gap energy of AlGaAsSb is large, it is possible to suppress the generation of the surface leakage current CL between the second active layer 63 and the tunnel junction portion T. Therefore, also in the light emitting diode element 1 according to the second modification example, it is possible to improve the light emission output.

In the second modification example, the conductivity type (first conductivity type) of the first semiconductor layer 51 is p-type, and the conductivity type (second conductivity type) of the second semiconductor layer 57 is n-type. Generally, the light transmittance of an n-type semiconductor is higher than that of a p-type semiconductor. Therefore, for example, by setting the conductivity type of the second semiconductor layer 57 to n-type in the case of adopting a configuration in which light is emitted from the fourth semiconductor layer 65 side, light generated in the first active layer 55 and the second active layer 63 can be efficiently emitted to the outside of the light emitting diode element 1.

In the second modification example, the electron barrier layer 64 is arranged between the second active layer 63 and the third semiconductor layer 61. Therefore, it is possible to suppress the generation of the surface leakage current CL between the second active layer 63 and the tunnel junction portion T. The electron barrier layer 64 suppresses the leakage of carriers injected into the second active layer 63 to the third semiconductor layer 61. Therefore, since the number of carriers in the second active layer 63 can be kept high, high light emission efficiency can be obtained. When the first conductivity type (third semiconductor layer 61) is p-type and the second conductivity type (fourth semiconductor layer 65) is n-type, the leakage of electrons injected into the second active layer 63 to the third semiconductor layer 61 can be suppressed by the electron barrier layer 64. Therefore, high light emission efficiency can be obtained.

In the second modification example, the electron barrier layer 64 includes AlGaAsSb, the second active layer 63 includes a plurality of well layers and a plurality of barrier layers that are alternately stacked, each of the plurality of barrier layers includes AlInAs, and a barrier layer located closest to the first side among the plurality of barrier layers is in contact with the electron barrier layer 64. Therefore, it is possible to suppress the generation of a tunnel current that does not contribute to light emission in a contact portion between the electron barrier layer 64 and the second active layer 63.

Figure 13:
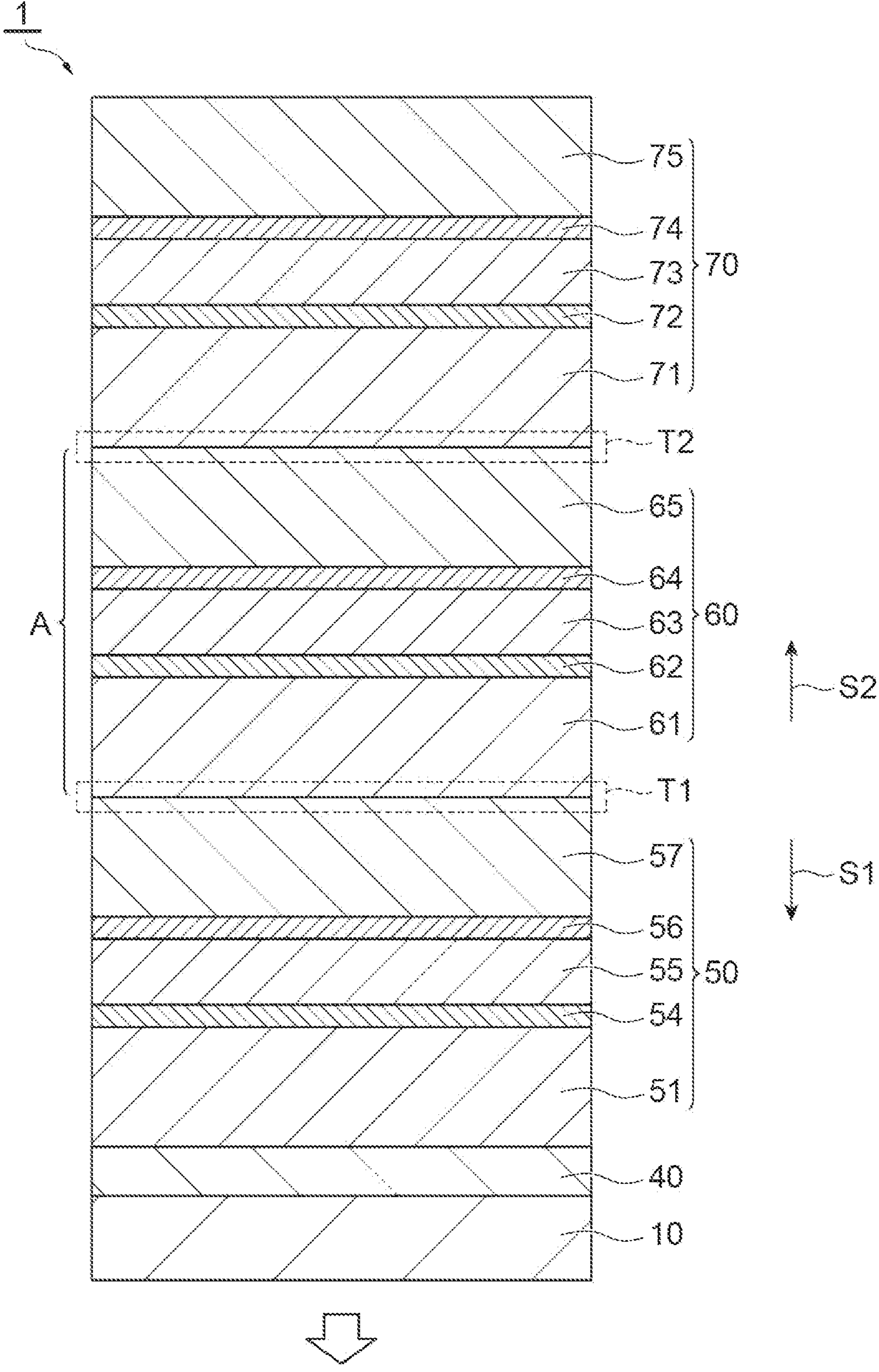
FIG. 13 is a schematic cross-sectional view of a semiconductor stacked body provided in a light emitting diode element according to a third modification example.

In a third modification example shown in FIG. 13, the light emitting diode element 1 further includes a third element portion 70. The third element portion 70 is arranged on the second element portion 60. The third element portion 70 includes a seventh semiconductor layer 71, a hole barrier layer 72, a third active layer 73, an electron barrier layer 74, and an eighth semiconductor layer 75. The seventh semiconductor layer 71, the hole barrier layer 72, the third active layer 73, the electron barrier layer 74, and the eighth semiconductor layer 75 are stacked in this order from the substrate 10 side.

The seventh semiconductor layer 71 is formed on the fourth semiconductor layer 65. The seventh semiconductor layer 71 is in contact with the fourth semiconductor layer 65. The seventh semiconductor layer 71 is located on the first side S1 with respect to the third active layer 73. The seventh semiconductor layer 71 includes, for example, InAs and has an n-type conductivity type.

The hole barrier layer 72 is formed on the seventh semiconductor layer 71 and arranged between the seventh semiconductor layer 71 and the third active layer 73. The hole barrier layer 72 includes, for example, AlInAs and has an n-type conductivity type. The hole barrier layer 72 suppresses the leakage of holes supplied to the third active layer 73 to the seventh semiconductor layer 71 (first side S1).

The third active layer 73 is formed on the hole barrier layer 72. The third active layer 73 is, for example, a non-doped layer. The third active layer 73 is arranged between the seventh semiconductor layer 71 and the eighth semiconductor layer 75. Similar to the first active layer 55 and the second active layer 63, the third active layer 73 includes a plurality of well layers and a plurality of barrier layers that are alternately stacked, and has a multiple quantum well structure. Each well layer includes, for example, InAsSb, and each barrier layer includes, for example, AlInAs. A barrier layer located closest to the second side S2 among the plurality of barrier layers is in contact with the electron barrier layer 74.

The third active layer 73 may be configured to generate light having a wavelength of, for example, 3 μm or more and 5 μm or less. The wavelength of the light generated by the third active layer 73 may be different from the wavelength of the light generated by the first active layer 55 and the second active layer 63. The light generated by the third active layer 73 passes through the substrate 10. In other words, the substrate 10 is transparent to the light generated by the third active layer 73.

The electron barrier layer 74 is formed on the third active layer 73 and arranged between the third active layer 73 and the eighth semiconductor layer 75. In this modification example, the electron barrier layer 74 includes AlGaAsSb and has a p-type conductivity type. The electron barrier layer 74 suppresses the leakage of electrons supplied to the third active layer 73 to the eighth semiconductor layer 75 (second side S2).

The eighth semiconductor layer 75 is located on the second side S2 with respect to the third active layer 73. The eighth semiconductor layer 75 has a p-type conductivity type. The eighth semiconductor layer 75 has the same configuration as the fourth semiconductor layer 65 in the embodiment described above. Specifically, the eighth semiconductor layer 75 includes a layer (hereinafter, referred to as a first layer) corresponding to the semiconductor layer 66 and a layer (hereinafter, referred to as a second layer) corresponding to the contact layer 67. The first layer is formed on the electron barrier layer 74. The first layer includes, for example, InAs and has a p-type conductivity type. The second layer is formed on the first layer. The second layer includes, for example, InAs and has a p-type conductivity type. In addition, the fourth semiconductor layer 65 according to the third modification example does not include the semiconductor layer 66 and the contact layer 67, and has the same configuration as the second semiconductor layer 57 in the embodiment described above.

In the third modification example, the second element portion 60 and the third element portion 70 are electrically connected to each other by a second tunnel junction portion T2. In this modification example, a tunnel junction that connects the first element portion 50 and the second element portion 60 to each other is referred to as a first tunnel junction portion T1 in order to distinguish from the second tunnel junction portion T2. In this modification example, the p-type fourth semiconductor layer 65 and the n-type seventh semiconductor layer 71 are in contact with each other to be tunnel-junctioned to each other, and the second tunnel junction portion T2 is formed by the fourth semiconductor layer 65 and the seventh semiconductor layer 71 tunnel-junctioned to each other. More specifically, a contact portion between the fourth semiconductor layer 65 and the seventh semiconductor layer 71 forms the second tunnel junction portion T2. In this modification example, the electron barrier layer 56 (first electron barrier layer) is arranged between the first active layer 55 and the first tunnel junction portion T1, and the electron barrier layer 64 (third electron barrier layer) is arranged between the second active layer 63 and the second tunnel junction portion T2.

According to the third modification example, it is also possible to suppress the generation of the surface leakage current CL between the first active layer 55 and the first tunnel junction portion T1 by using the electron barrier layer 56. In addition, in the third modification example, it is possible to suppress the generation of the surface leakage current CL between the second active layer 63 and the second tunnel junction portion T2 by using the electron barrier layer 64. As a result, it is possible to improve the light emission output. In addition, it is also possible to improve the light emission output by providing three active layers of the first active layer 55, the second active layer 63, and the third active layer 73.

In the third modification example, the third element portion 70 may be arranged on the first side S1 with respect to the first element portion 50. For example, the third element portion 70 may be arranged between the buffer layer 40 and the first element portion 50. In this case, the seventh semiconductor layer 71 of the third element portion 70 may include a layer corresponding to the current diffusion layer 52 formed on the buffer layer 40 and a layer corresponding to the current blocking layer 53 formed on the current diffusion layer 52, and the first semiconductor layer 51 of the first element portion 50 may have the same configuration as the third semiconductor layer 61 of the second element portion 60. In addition, the eighth semiconductor layer 75 of the third element portion 70 may have the same configuration as the second semiconductor layer 57 of the first element portion 50.

In addition, in the third modification example, the light emitting diode element 1 may further include the third element portion 70 arranged on the first side S1 with respect to the first element portion 50 in addition to the third element portion 70 arranged on the second side S2 with respect to the second element portion 60. That is, a pair of third element portions 70 may be arranged so as to interpose the first element portion 50 and the second element portion 60 therebetween in the stacking direction.

In addition, at least one fourth element portion having the same configuration as the third element portion 70 may be further arranged on the second side S2 with respect to the third element portion 70. In addition, when the third element portion 70 is arranged on the first side S1 with respect to the first element portion 50, at least one fourth element portion may be further arranged on the first side S1 with respect to the third element portion 70. At least one fourth element portion may be arranged on both sides of the first side S1 and the second side S2 with respect to a stacked body including the first element portion 50, the second element portion 60, and the third element portion 70. The number of element portions included in the light emitting diode element 1 is not limited, and the light emitting diode element 1 may include four or more element portions.

As a fourth modification example, the electron barrier layer 56 may include AlInAsSb instead of AlGaAsSb in the embodiment described above. Also in this case, since the band gap energy of AlInAsSb is relatively large like AlGaAsSb, it is possible to suppress the generation of the surface leakage current CL between the first active layer 55 and the tunnel junction portion T. Therefore, according to the fourth modification example, it is also possible to improve the light emission output as in the embodiment described above.

In the embodiment described above, the barrier layer 552A located closest to the second side S2 among the plurality of barrier layers 552 included in the first active layer 55 is in contact with the electron barrier layer 56. In the fourth modification example, however, the well layer 551A located closest to the second side S2 among the plurality of well layers 551 may be in contact with the electron barrier layer 56. In other words, the well layer 551A may be located between the barrier layer 552A and the electron barrier layer 56. In the fourth modification example, the valence band of AlInAsSb included in the electron barrier layer 56 has a lower energy position than the valence band of InAsSb included in the well layer 551. Therefore, in the fourth modification example, a tunnel current is less likely to be generated between the electron barrier layer 56 and the first active layer 55 even if the electron barrier layer 56 and the well layer 551 are in contact with each other. Other electron barrier layers (for example, the electron barrier layers 64 and 74) of the light emitting diode element 1 may similarly include AlInAsSb. Also in the fourth modification example, the barrier layer 552A may be in contact with the electron barrier layer 56 as in the embodiment described above.

As a fifth modification example, the well layer 551A located closest to the second side S2 among the plurality of well layers 551 included in the first active layer 55 may be in contact with the electron barrier layer 56 in the embodiment described above. In other words, the well layer 551A may be located between the electron barrier layer 56 and the barrier layer 552A located closest to the second side S2 among the plurality of barrier layers 552. According to the fifth modification example, it is also possible to improve the light emission output as in the embodiment described above. Similarly, well layers included in the second active layer 63 and the third active layer 73 may be in contact with the electron barrier layer.

The present disclosure is not limited to the embodiment and its modification examples described above. For example, the materials and shapes of the respective components are not limited to the materials and shapes described above, and various materials and shapes can be adopted.

When the light emitting diode element 1 includes two element portions (two active layers) as in the embodiment described above and the first semiconductor layer 51 is n-type, the electron barrier layer including AlGaAsSb or AlInAsSb may be arranged at least between the first active layer 55 and the tunnel junction portion T. Specifically, in the example shown in FIG. 3, at least the electron barrier layer 56 may be arranged, the electron barrier layer 64 may be omitted or may be formed of materials (for example, AlInAs) other than AlGaAsSb or AlInAsSb. When the first semiconductor layer 51 is p-type as in the second modification example, the electron barrier layer including AlGaAsSb or AlInAsSb may be arranged at least between the second active layer 63 and the tunnel junction portion T. Specifically, in the example shown in FIG. 12, at least the electron barrier layer 64 may be arranged, the electron barrier layer 56 may be omitted or may be formed of materials (for example, AlInAs) other than AlGaAsSb or AlInAsSb.

In the first modification example shown in FIG. 11, the electron barrier layer 56 may be arranged between the second semiconductor layer 57 and the fifth semiconductor layer 58. In addition, in the first modification example shown in FIG. 11, the p-type and n-type conductivity types may be reversed. For example, the first semiconductor layer 51, the third semiconductor layer 61, and the fifth semiconductor layer 58 may have a p-type conductivity type, and the second semiconductor layer 57, the fourth semiconductor layer 65, and the sixth semiconductor layer 68 may have an n-type conductivity type. In this case, the positions of the electron barrier layer and the hole barrier layer shown in FIG. 11 are reversed. Specifically, the electron barrier layer 56 is located between the first semiconductor layer 51 and the first active layer 55, and the hole barrier layer 54 is located between the first active layer 55 and the second semiconductor layer 57. Similarly, the electron barrier layer 64 is arranged between the third semiconductor layer 61 and the second active layer 63, and the hole barrier layer 62 is arranged between the second active layer 63 and the fourth semiconductor layer 65. In this case, the electron barrier layer 64 may be arranged between the third semiconductor layer 61 and the sixth semiconductor layer 68.

When the light emitting diode element 1 includes three element portions (three active layers) as in the third modification example and the first semiconductor layer 51 is n-type, the electron barrier layer including AlGaAsSb or AlInAsSb may be arranged at least between the first active layer 55 and the first tunnel junction portion T1 or between the second active layer 63 and the second tunnel junction portion T2. Specifically, in the example shown in FIG. 13, at least one of the electron barrier layer 56 and the electron barrier layer 64 may be arranged. When one of the electron barrier layer 56 and the electron barrier layer 64 is arranged, the other one may be omitted or may be formed of materials (for example, AlInAs) other than AlGaAsSb or AlInAsSb.

In the third modification example, the p-type and n-type conductivity types may be reversed. For example, the first semiconductor layer 51, the third semiconductor layer 61, and the seventh semiconductor layer 71 may have a p-type conductivity type, and the second semiconductor layer 57, the fourth semiconductor layer 65, and the eighth semiconductor layer 75 may have an n-type conductivity type. In this case, the positions of the electron barrier layer and the hole barrier layer shown in FIG. 13 are reversed. Specifically, the electron barrier layer 56 is located between the first semiconductor layer 51 and the first active layer 55, and the hole barrier layer 54 is located between the first active layer 55 and the second semiconductor layer 57. Similarly, the electron barrier layer 64 is arranged between the third semiconductor layer 61 and the second active layer 63, and the hole barrier layer 62 is arranged between the second active layer 63 and the fourth semiconductor layer 65. The electron barrier layer 74 is arranged between the seventh semiconductor layer 71 and the third active layer 73, and the hole barrier layer 72 is arranged between the third active layer 73 and the eighth semiconductor layer 75. In this case, the electron barrier layer 74 (second electron barrier layer) is arranged between the third active layer 73 and the second tunnel junction portion T2, and the electron barrier layer 64 (fourth electron barrier layer) is arranged between the second active layer 63 and the first tunnel junction portion T1. When the p-type and the n-type are reversed in the third modification example, the electron barrier layer including AlGaAsSb or AlInAsSb may be arranged at least between the third active layer 73 and the second tunnel junction portion T2 or between the second active layer 63 and the first tunnel junction portion T1. Specifically, the electron barrier layer including AlGaAsSb or AlInAsSb may be arranged at the position of at least one of the hole barrier layer 72 and the hole barrier layer 62 shown in FIG. 13.

In the third modification example, the number of active layers may be increased to four or more. In this case, for example, a stacked portion having the same configuration as a stacked portion A shown in FIG. 13 is added between the fourth semiconductor layer 65 and the seventh semiconductor layer 71 by the number corresponding to the number of active layers. The stacked portion A includes the third semiconductor layer 61, the hole barrier layer 62, the second active layer 63, the electron barrier layer 64, and the fourth semiconductor layer 65. As an example, when the number of active layers is 4, one stacked portion having the same configuration as the stacked portion A is added, and when the number of active layers is 5, two stacked portions having the same configuration as the stacked portion A are added.

Here, the arrangement position of the electron barrier layer including AlGaAsSb or AlInAsSb will be further described with reference to the example in FIG. 3 and the example in FIG. 13 described above. The contents described below are not limited to the configuration having two active layers (example in FIG. 3) and the configuration having three active layers (example in FIG. 13), and can also be applied to a configuration having four or more active layers. The light emitting diode element 1 includes a plurality of element portions stacked along a predetermined stacking direction. In the example shown in FIG. 3, the first element portion 50 and the second element portion 60 correspond to the plurality of element portions. In the example shown in FIG. 13, the first element portion 50, the second element portion 60, and the third element portion 70 correspond to the plurality of element portions.

Each of the plurality of element portions has an n-type semiconductor layer, a p-type semiconductor layer, and an active layer arranged between the n-type semiconductor layer and the p-type semiconductor layer. In the example shown in FIG. 3, the first semiconductor layer 51 and the third semiconductor layer 61 correspond to n-type semiconductor layers, and the second semiconductor layer 57 and the fourth semiconductor layer 65 correspond to p-type semiconductor layers. In addition, the first active layer 55 and the second active layer 63 correspond to active layers arranged between the n-type semiconductor layer and the p-type semiconductor layer. In the example shown in FIG. 13, the first semiconductor layer 51, the third semiconductor layer 61, and the seventh semiconductor layer 71 correspond to n-type semiconductor layers, and the second semiconductor layer 57, the fourth semiconductor layer 65, and the eighth semiconductor layer 75 correspond to p-type semiconductor layers. In addition, the first active layer 55, the second active layer 63, and the third active layer 73 correspond to active layers arranged between the n-type semiconductor layer and the p-type semiconductor layer.

The plurality of element portions include a first terminating element portion located at the end of the first side S1 in the stacking direction and a second terminating element portion located at the end of the second side S2 opposite to the first side S1 in the stacking direction. In the example shown in FIG. 3, the first element portion 50 corresponds to the first terminating element portion, and the second element portion 60 corresponds to the second terminating element portion. In the example shown in FIG. 13, the first element portion 50 corresponds to the first terminating element portion, and the third element portion 70 corresponds to the second terminating element portion.

In each of the plurality of element portions, an n-type (first conductivity type) semiconductor layer is located on the first side S1 with respect to the active layer, and a p-type (second conductivity type) semiconductor layer is located on the second side S2 with respect to the active layer. Element portions adjacent to each other in the stacking direction are electrically connected to each other by tunnel junction portions. In the example shown in FIG. 3, in the first element portion 50, the first semiconductor layer 51 is located on the first side S1 with respect to the first active layer 55, and the second semiconductor layer 57 is located on the second side S2 with respect to the first active layer 55. In addition, in the second element portion 60, the third semiconductor layer 61 is located on the first side S1 with respect to the second active layer 63, and the fourth semiconductor layer 65 is located on the second side S2 with respect to the second active layer 63. The first element portion 50 and the second element portion 60 adjacent to each other are connected to each other by the tunnel junction portion T. In the example shown in FIG. 13, in the first element portion 50, the first semiconductor layer 51 is located on the first side S1 with respect to the first active layer 55, and the second semiconductor layer 57 is located on the second side S2 with respect to the first active layer 55. In addition, in the second element portion 60, the third semiconductor layer 61 is located on the first side S1 with respect to the second active layer 63, and the fourth semiconductor layer 65 is located on the second side S2 with respect to the second active layer 63. In addition, in the third element portion 70, the seventh semiconductor layer 71 is located on the first side S1 with respect to the third active layer 73, and the eighth semiconductor layer 75 is located on the second side S2 with respect to the third active layer 73. The first element portion 50 and the second element portion 60 adjacent to each other are connected to each other by the first tunnel junction portion T1, and the second element portion 60 and the third element portion 70 adjacent to each other are connected to each other by the second tunnel junction portion T2.

In the light emitting diode element 1, a reference element portion, which is at least one of the plurality of element portions other than the second terminating element portion, includes an electron barrier layer arranged between an active layer of the reference element portion and a tunnel junction portion that electrically connects the reference element portion to an element portion adjacent to the reference element portion on the second side S2. The electron barrier layer includes AlGaAsSb or AlInAsSb. In the example shown in FIG. 3, the first element portion 50 corresponds to the reference element portion. An element portion adjacent to the first element portion 50 on the second side S2 is the second element portion 60, and a tunnel junction portion electrically connecting the first element portion 50 to the second element portion 60 is the tunnel junction portion T. The electron barrier layer 56 is arranged between the first active layer 55 of the first element portion 50 and the tunnel junction portion T, and the electron barrier layer 56 includes AlGaAsSb or AlInAsSb. In the example shown in FIG. 13, each of the first element portion 50 and the second element portion 60 corresponds to the reference element portion. That is, in the examples shown in FIGS. 3 and 13, all element portions other than the second terminating element portion among the plurality of element portions are reference element portions. In the example shown in FIG. 13, an element portion adjacent to the first element portion 50 on the second side S2 is the second element portion 60, and a tunnel junction portion electrically connecting the first element portion 50 to the second element portion 60 is the first tunnel junction portion T1. The electron barrier layer 56 is arranged between the first active layer 55 of the first element portion 50 and the first tunnel junction portion T1, and the electron barrier layer 56 includes AlGaAsSb or AlInAsSb. An element portion adjacent to the second element portion 60 on the second side S2 is the third element portion 70, and a tunnel junction portion electrically connecting the second element portion 60 to the third element portion 70 is the second tunnel junction portion T2. The electron barrier layer 64 is arranged between the second active layer 63 of the second element portion 60 and the second tunnel junction portion T2, and the electron barrier layer 64 includes AlGaAsSb or AlInAsSb.

In the examples shown in FIGS. 3 and 13, all element portions other than the second terminating element portion among the plurality of element portions are reference element portions. However, only one of the plurality of element portions other than the second terminating element portion may be the reference element portion. For example, in the example shown in FIG. 13, only the first element portion 50 may be the reference element portion. In this case, the electron barrier layer including AlGaAsSb or AlInAsSb is arranged between the first active layer 55 and the first tunnel junction portion T1, and the electron barrier layer including AlGaAsSb or AlInAsSb is not arranged between the second active layer 63 and the second tunnel junction portion T2. Alternatively, in the example shown in FIG. 13, only the second element portion 60 may be the reference element portion. In this case, the electron barrier layer including AlGaAsSb or AlInAsSb is arranged between the second active layer 63 and the second tunnel junction portion T2, and the electron barrier layer including AlGaAsSb or AlInAsSb is not arranged between the first active layer 55 and the first tunnel junction portion T1.

As described above, in the light emitting diode element 1, a reference element portion, which is at least one of the plurality of element portions other than the second terminating element portion, includes an electron barrier layer arranged between an active layer of the reference element portion and a tunnel junction portion that electrically connects the reference element portion to an element portion adjacent to the reference element portion on the second side. The electron barrier layer includes AlGaAsSb or AlInAsSb. Therefore, it is possible to suppress the generation of the surface leakage current between the active layer of the reference element portion and the tunnel junction portion by using the electron barrier layer. As a result, it is possible to suppress a decrease in the reverse bias voltage applied to the tunnel junction portion due to the surface leakage current, and it is possible to obtain a light emission output proportional to the number of active layers even in a low current region.

In addition, in the light emitting diode element 1, all the element portions other than the second terminating element portion among the plurality of element portions are reference element portions. Therefore, it is possible to effectively suppress the generation of the surface leakage current.

Next, a case where the p-type and n-type are reversed will be described with reference to the above example shown in FIG. 12. The contents described below can be applied not only to the configuration having two active layers (example in FIG. 12) but also to the configuration having three or more active layers. The light emitting diode element 1 includes a plurality of element portions stacked along a predetermined stacking direction. In the example shown in FIG. 12, the first element portion 50 and the second element portion 60 correspond to the plurality of element portions.

Each of the plurality of element portions has a p-type semiconductor layer, an n-type semiconductor layer, and an active layer arranged between the p-type semiconductor layer and the n-type semiconductor layer. In the example shown in FIG. 12, the first semiconductor layer 51 and the third semiconductor layer 61 correspond to p-type semiconductor layers, and the second semiconductor layer 57 and the fourth semiconductor layer 65 correspond to n-type semiconductor layers. In addition, the first active layer 55 and the second active layer 63 correspond to active layers arranged between the p-type semiconductor layer and the n-type semiconductor layer.

The plurality of element portions include a first terminating element portion located at the end of the first side S1 in the stacking direction and a second terminating element portion located at the end of the second side S2 opposite to the first side S1 in the stacking direction. In the example shown in FIG. 12, the first element portion 50 corresponds to the first terminating element portion, and the second element portion 60 corresponds to the second terminating element portion.

In each of the plurality of element portions, a p-type (first conductivity type) semiconductor layer is located on the first side S1 with respect to the active layer, and an n-type (second conductivity type) semiconductor layer is located on the second side S2 with respect to the active layer. Element portions adjacent to each other in the stacking direction are electrically connected to each other by tunnel junction portions. In the example shown in FIG. 12, in the first element portion 50, the first semiconductor layer 51 is located on the first side S1 with respect to the first active layer 55, and the second semiconductor layer 57 is located on the second side S2 with respect to the first active layer 55. In addition, in the second element portion 60, the third semiconductor layer 61 is located on the first side S1 with respect to the second active layer 63, and the fourth semiconductor layer 65 is located on the second side S2 with respect to the second active layer 63. The first element portion 50 and the second element portion 60 adjacent to each other are connected to each other by the tunnel junction portion T.

In the light emitting diode element 1, a reference element portion, which is at least one of the plurality of element portions other than the first terminating element portion, includes an electron barrier layer arranged between an active layer of the reference element portion and a tunnel junction portion that electrically connects the reference element portion to an element portion adjacent to the reference element portion on the first side S1. The electron barrier layer includes AlGaAsSb or AlInAsSb. In the example shown in FIG. 12, the second element portion 60 corresponds to the reference element portion. An element portion adjacent to the second element portion 60 on the first side S1 is the first element portion 50, and a tunnel junction portion electrically connecting the second element portion 60 to the first element portion 50 is the tunnel junction portion T. The electron barrier layer 64 is arranged between the second active layer 63 of the second element portion 60 and the tunnel junction portion T, and the electron barrier layer 64 includes AlGaAsSb or AlInAsSb. In the example shown in FIG. 12, all element portions other than the first terminating element portion among the plurality of element portions are reference element portions. However, when there are three or more element portions, only one of the plurality of element portions other than the first terminating element portion may be the reference element portion.

In the embodiment and its modification examples described above, the electron barrier layers 56, 64, and 74 may be non-doped layers. The first active layer 55, the second active layer 63, and the third active layer 73 may be p-type doped layers. In these cases, the generation of a depletion layer at a contact portion between the electron barrier layer and the active layer is suppressed. Therefore, the generation of a tunnel current at the contact portion can be further suppressed.

The first semiconductor layer 51, the second semiconductor layer 57, the third semiconductor layer 61, the fourth semiconductor layer 65, the fifth semiconductor layer 58, the sixth semiconductor layer 68, the seventh semiconductor layer 71, and the eighth semiconductor layer 75 may be formed of InAs only or may be formed of a mixed crystal including InAs, for example, may be formed of AlInAs, InGaAs, InAsSb, or the like so as to include 50% or more of InAs. Cases where the semiconductor layer includes 50% or more of InAs include a case where the semiconductor layer is formed of InAs only (including 100% InAs). InAs included in the semiconductor layer may be doped InAs. The semiconductor layer may include a plurality of layers. In this case, the plurality of layers may include a layer formed of a material (for example, GaSb) other than InAs. When each semiconductor layer includes 50% or more of InAs, the surface leakage current CL described above is likely to be generated. However, the electron barrier layer 56 including AlGaAsSb is provided in the light emitting diode element 1. Therefore, even in such a case, it is possible to suppress the generation of the surface leakage current CL and improve the light emission output.

In the embodiment described above, the first semiconductor layer 51, the second semiconductor layer 57, the third semiconductor layer 61, and the fourth semiconductor layer 65 are formed of the same material (InAs), but these layers may be formed of different materials. In this case, the material of each layer may satisfy the following conditions. The lattice mismatch of the lattice constants of the second semiconductor layer 57, the third semiconductor layer 61, and the fourth semiconductor layer 65 with respect to the lattice constant of the first semiconductor layer 51 may be, for example, 0.9% or less or 0.6% or less. The lattice mismatch of the average lattice constants of well layers and barrier layers in each of the first active layer 55, the second active layer 63, and the third active layer 73 with respect to the lattice constant of the first semiconductor layer 51 may be, for example, 0.9% or less or 0.6% or less. The lattice mismatch of the lattice constant of each of the electron barrier layers 56 and 64 with respect to the lattice constant of the first semiconductor layer 51 may be, for example, 1.0% or less. When the lattice mismatch between the first semiconductor layer 51 and another semiconductor layer is small, the accumulation of lattice strain is reduced, so that crystal defects that occur during stacking can be suppressed. The number of pairs of well layers and barrier layers (the number of quantum wells) in the first active layer 55, the second active layer 63, and the third active layer 73 may be, for example, one.

The thickness of the first semiconductor layer 51 may be smaller than the thickness of the third semiconductor layer 61. The outer shape of the mesa portion 22 when viewed in the Z direction may be circular or polygonal. The wavelength of light generated by the second active layer 63 may be the same as the wavelength of light generated by the first active layer 55.

What is claimed is:

1. A light emitting diode element, comprising:

a first element portion including a first semiconductor layer of a first conductivity type, a second semiconductor layer of a second conductivity type different from the first conductivity type, and a first active layer arranged between the first semiconductor layer and the second semiconductor layer;

a second element portion that includes a third semiconductor layer of the first conductivity type, a fourth semiconductor layer of the second conductivity type, and a second active layer arranged between the third semiconductor layer and the fourth semiconductor layer and is arranged on the first element portion; and a tunnel junction portion formed by a part of the first element portion and a part of the second element portion, wherein a side on which the first element portion is located with respect to the second element portion is a first side and a side on which the second element portion is located with respect to the first element portion is a second side, the second element portion is arranged on the first element portion so that the third semiconductor layer is located on the first side with respect to the second active layer and the second semiconductor layer is located on the second side with respect to the first active layer, a portion of the first element portion other than the part and a portion of the second element portion other than the part are electrically connected to each other by the tunnel junction portion, one of i) when the first conductivity type is n-type and the second conductivity type is p-type, the first element portion further includes an electron barrier layer arranged between the first active layer and the tunnel junction portion, or ii) when the first conductivity type is p-type and the second conductivity type is n-type, the second element portion further includes an electron barrier layer arranged between the second active layer and the tunnel junction portion, each of the first active layer and the second active layer has a quantum well structure, the electron barrier layer includes AlGaAsSb or AlInAsSb, and the first semiconductor layer includes 50% or more of InAs, the second semiconductor layer includes 50% or more of InAs, the third semiconductor layer includes 50% or more of InAs, and the fourth semiconductor layer includes 50% or more of InAs.

2. The light emitting diode element according to claim 1, wherein the tunnel junction portion is formed by the second semiconductor layer and the third semiconductor layer tunnel-junctioned to each other.

3. The light emitting diode element according to claim 1, wherein the first element portion further includes a fifth semiconductor layer of the second conductivity type having an impurity concentration higher than that of the second semiconductor layer, the second element portion further includes a sixth semiconductor layer of the first conductivity type having an impurity concentration higher than that of the third semiconductor layer, the fifth semiconductor layer is arranged on the second side with respect to the second semiconductor layer, the sixth semiconductor layer is arranged on the first side with respect to the third semiconductor layer, and the tunnel junction portion is formed by the fifth semiconductor layer and the sixth semiconductor layer tunnel-junctioned to each other.

4. The light emitting diode element according to claim 1, wherein the first conductivity type is n-type, and the second conductivity type is p-type.

5. The light emitting diode element according to claim 4, further comprising:

a substrate arranged on the first side with respect to the first semiconductor layer, wherein the substrate is transparent to light generated by the first active layer and the second active layer.

6. The light emitting diode element according to claim 4, wherein the electron barrier layer is arranged between the first active layer and the second semiconductor layer.

7. The light emitting diode element according to claim 4, wherein the electron barrier layer includes AlGaAsSb, the first active layer includes a plurality of well layers and a plurality of barrier layers, the plurality of well layers and the plurality of barrier layers being alternately stacked, each of the plurality of barrier layers includes AlInAs, and a barrier layer located closest to the second side among the plurality of barrier layers is in contact with the electron barrier layer.

8. The light emitting diode element according to claim 1, wherein the first conductivity type is p-type, and the second conductivity type is n-type.

9. The light emitting diode element according to claim 8, wherein the electron barrier layer is arranged between the second active layer and the third semiconductor layer.

10. The light emitting diode element according to claim 8, wherein the electron barrier layer includes AlGaAsSb, the second active layer includes a plurality of well layers and a plurality of barrier layers, the plurality of well layers and the plurality of barrier layers being alternately stacked, each of the plurality of barrier layers includes AlInAs, and a barrier layer located closest to the first side among the plurality of barrier layers is in contact with the electron barrier layer.

11. The light emitting diode element according to claim 1, wherein the electron barrier layer includes AlInAsSb.

12. The light emitting diode element according to claim 1, wherein a thickness of the first semiconductor layer is larger than a thickness of the third semiconductor layer.

13. The light emitting diode element according to claim 1, further comprising:

a substrate arranged on the first side with respect to the first semiconductor layer, wherein the substrate includes GaAs.

14. The light emitting diode element according to claim 1, wherein each of the first active layer and the second active layer is configured to generate light having a wavelength of 3 μm or more and 5 μm or less.

15. The light emitting diode element according to claim 1, wherein a wavelength of light generated by the first active layer is different from a wavelength of light generated by the second active layer.

16. The light emitting diode element according to claim 1, wherein, when the first conductivity type is n-type and the second conductivity type is p-type, the second element portion further includes an electron barrier layer arranged between the second active layer and the fourth semiconductor layer, and when the first conductivity type is p-type and the second conductivity type is n-type, the first element portion further includes an electron barrier layer arranged between the first active layer and the first semiconductor layer.

17. The light emitting diode element according to claim 16, wherein, when the first conductivity type is n-type and the second conductivity type is p-type, the electron barrier layer arranged between the second active layer and the fourth semiconductor layer includes AlGaAsSb or AlInAsSb, and when the first conductivity type is p-type and the second conductivity type is n-type, the electron barrier layer arranged between the first active layer and the first semiconductor layer includes AlGaAsSb or AlInAsSb.

18. The light emitting diode element according to claim 1, further comprising:

a third element portion including a semiconductor layer of the first conductivity type, a semiconductor layer of the second conductivity type, and an active layer arranged between the semiconductor layer of the first conductivity type and the semiconductor layer of the second conductivity type, wherein the third element portion is arranged on the first side with respect to the first element portion or on the second side with respect to the second element portion, and in the third element portion, the semiconductor layer of the first conductivity type is located on the first side with respect to the active layer, and the semiconductor layer of the second conductivity type is located on the second side with respect to the active layer.

19. A light emitting diode element, comprising:

a plurality of element portions stacked along a stacking direction, each of the plurality of element portions including a semiconductor layer of a first conductivity type, a semiconductor layer of a second conductivity type different from the first conductivity type, and an active layer arranged between the semiconductor layer of the first conductivity type and the semiconductor layer of the second conductivity type, wherein the plurality of element portions include a first terminating element portion located at an end on a first side in the stacking direction and a second terminating element portion located at an end on a second side opposite to the first side in the stacking direction, in each of the plurality of element portions, the semiconductor layer of the first conductivity type is located on the first side with respect to the active layer, and the semiconductor layer of the second conductivity type is located on the second side with respect to the active layer, the element portions adjacent to each other are electrically connected to each other by a tunnel junction portion, one of i) when the first conductivity type is n-type and the second conductivity type is p-type, a reference element portion that is at least one of the plurality of element portions other than the second terminating element portion further includes an electron barrier layer arranged between the active layer of the reference element portion and the tunnel junction portion electrically connecting the reference element portion to the element portion adjacent to the reference element portion on the second side, or ii) when the first conductivity type is p-type and the second conductivity type is n-type, a reference element portion that is at least one of the plurality of element portions other than the first terminating element portion further includes an electron barrier layer arranged between the active layer of the reference element portion and the tunnel junction portion electrically connecting the reference element portion to the element portion adjacent to the reference element portion on the first side, the active layer has a quantum well structure, the electron barrier layer includes AlGaAsSb or AlInAsSb, and the semiconductor layer of the first conductivity type includes 50% or more of InAs and the semiconductor layer of the second conductivity type includes 50% or more of InAs.

20. The light emitting diode element according to claim 19, wherein, when the first conductivity type is n-type and the second conductivity type is p-type, all of the plurality of element portions other than the second terminating element portion are the reference element portions, and when the first conductivity type is p-type and the second conductivity type is n-type, all of the plurality of element portions other than the first terminating element portion are the reference element portions.

* * * * *